(12) United States Patent
Kim et al.

(10) Patent No.: US 11,101,331 B2
(45) Date of Patent: Aug. 24, 2021

(54) DISPLAY APPARATUS AND METHOD OF MANUFACTURING THE SAME

(71) Applicant: Samsung Display Co., Ltd., Yongin-Si (KR)

(72) Inventors: Jeongki Kim, Hwaseong-si (KR); Jangil Kim, Asan-si (KR); Jeaheon Ahn, Hwaseong-si (KR); Yeogeon Yoon, Suwon-si (KR); Seok-joon Hong, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/666,855

(22) Filed: Oct. 29, 2019

(65) Prior Publication Data
US 2020/0168667 A1    May 28, 2020

(30) Foreign Application Priority Data

Nov. 23, 2018  (KR) .......................... 10-2018-0146644

(51) Int. Cl.
| | |
|---|---|
| G02B 5/30 | (2006.01) |
| H01L 27/32 | (2006.01) |
| H01L 51/56 | (2006.01) |
| H01L 51/52 | (2006.01) |
| H01L 51/50 | (2006.01) |

(52) U.S. Cl.
CPC ........ *H01L 27/322* (2013.01); *H01L 27/3232* (2013.01); *H01L 51/502* (2013.01); *H01L 51/5271* (2013.01); *H01L 51/56* (2013.01)

(58) Field of Classification Search
CPC .................................................. H01L 27/322
See application file for complete search history.

(56) References Cited

U.S. PATENT DOCUMENTS

| | | | |
|---|---|---|---|
| 2014/0104550 A1* | 4/2014 | Li | ..................... G02F 1/133555 349/106 |
| 2016/0363820 A1* | 12/2016 | Li | .......................... G02F 1/1337 |
| 2018/0004036 A1 | 1/2018 | Hwang et al. | |
| 2018/0045866 A1* | 2/2018 | Chae | ..................... G02F 1/1336 |
| 2018/0067245 A1* | 3/2018 | Giachino | .............. G01J 1/0418 |
| 2018/0120631 A1* | 5/2018 | Lee | ........... G02B 5/20 |
| 2018/0122836 A1* | 5/2018 | Kang | .................... H01L 33/502 |
| 2018/0157098 A1* | 6/2018 | Choung | ............ G02F 1/133502 |
| 2018/0175241 A1 | 6/2018 | Jain | |
| 2019/0155094 A1* | 5/2019 | Kim | .................. G02F 1/133617 |
| 2020/0279979 A1* | 9/2020 | Lee | ..................... H01L 25/0753 |

FOREIGN PATENT DOCUMENTS

| | | |
|---|---|---|
| KR | 101719740 B1 | 3/2017 |
| KR | 1020180002947 A | 1/2018 |
| KR | 1020180003662 A | 1/2018 |

* cited by examiner

*Primary Examiner* — Sang V Nguyen
(74) *Attorney, Agent, or Firm* — Cantor Colburn LLP

(57) ABSTRACT

A display apparatus includes a display panel including a base layer in which an active area and a peripheral area adjacent to the active area are defined, and a plurality of pixels, and a cover panel including a window layer, an optical filter layer disposed on a rear surface of the window layer, and a color filter layer disposed on the optical filter layer and including quantum dots. The optical filter layer includes a partition layer in which an opening is defined and which includes an organic material, a light blocking layer disposed on the partition layer, and a reflective layer disposed in the opening. The light blocking layer includes a metal.

20 Claims, 17 Drawing Sheets

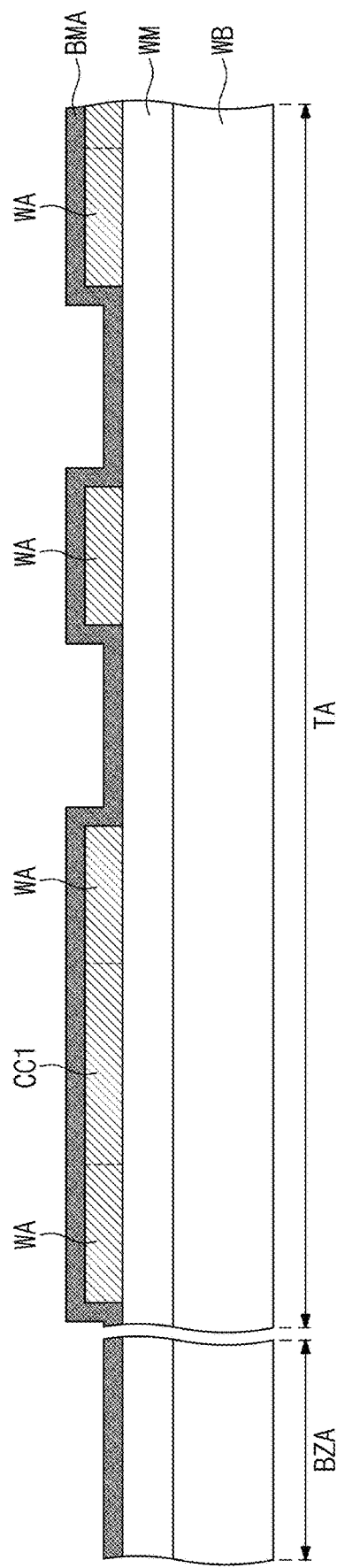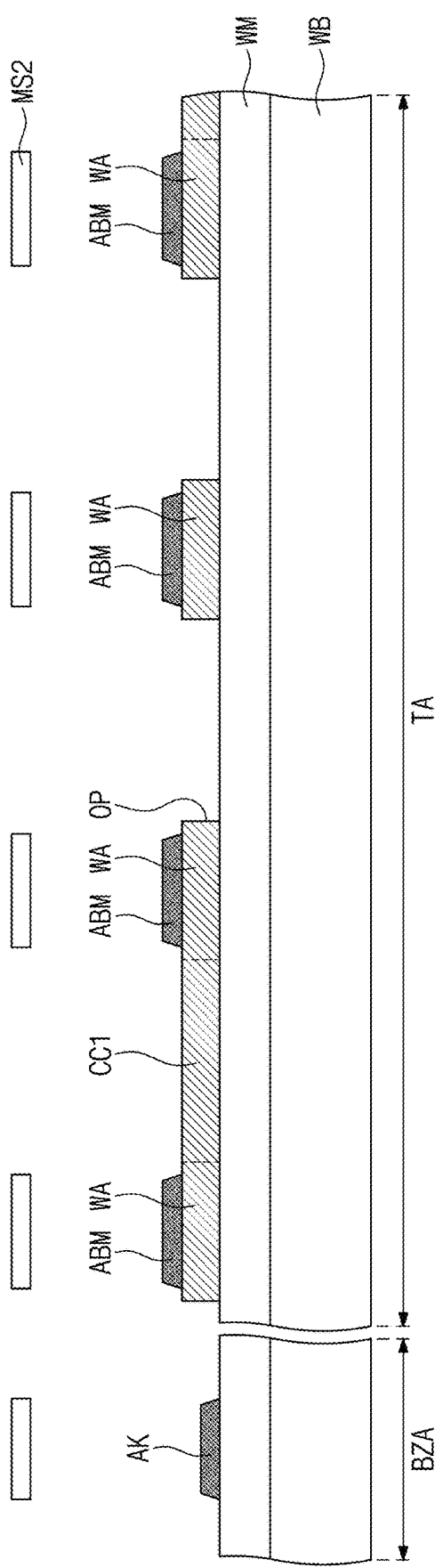

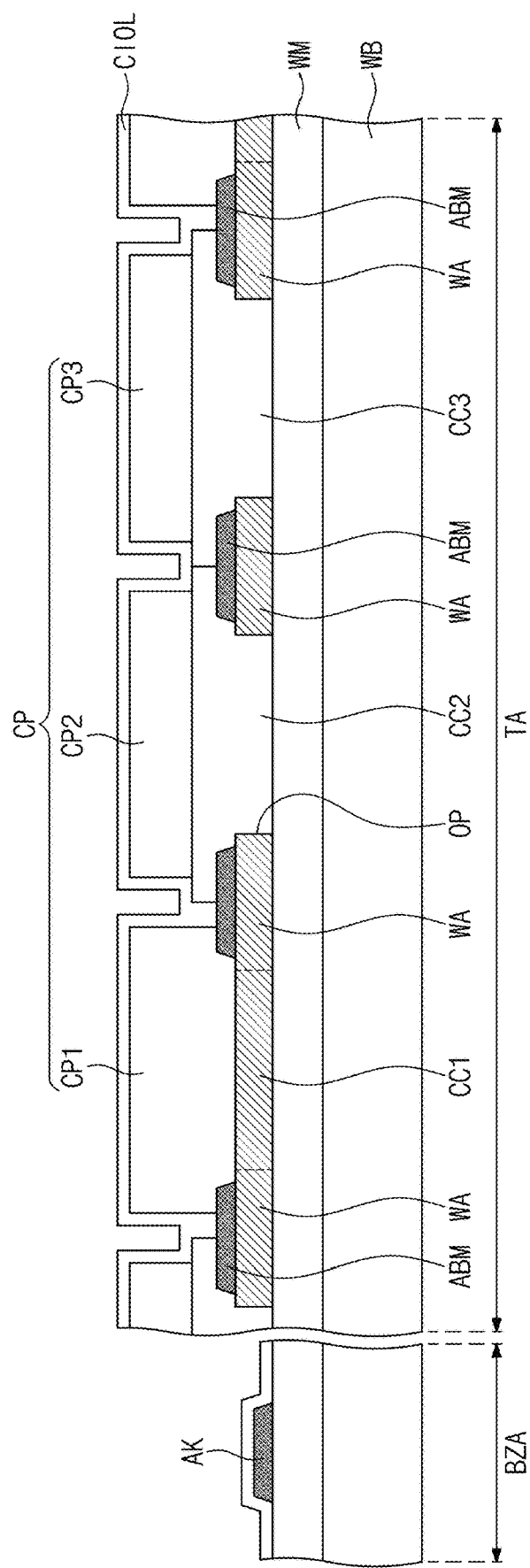

DISPLAY APPARATUS AND METHOD OF MANUFACTURING THE SAME

This application claims priority to Korean Patent Application No. 10-2018-0146644, filed on Nov. 23, 2018, and all the benefits accruing therefrom under 35 U.S.C. § 119, the content of which in its entirety is herein incorporated by reference.

BACKGROUND

1. Field

Exemplary embodiments of the invention herein relate to a display apparatus and a method of manufacturing the same, and more particularly, to a display apparatus with improved reliability and a method of manufacturing the same.

2. Description of Related Art

Display apparatuses may be activated by electrical signals. The display apparatuses may include display panels for displaying images. Display apparatuses may include various types such as a liquid crystal display ("LCD") apparatus, an organic light emitting display apparatus, a plasma display panel ("PDP") apparatus, a quantum dot display apparatus, a field emission display ("FED") apparatus, and an electrophoretic display ("EPD") apparatus.

An organic light emitting display panel of the display panels may have advantages such as low power consumption, high brightness and high response speed characteristics. The organic light emitting display panel may be formed using a method of forming a red organic light emitting layer for emitting red light, a green organic light emitting layer for emitting green light, and a blue organic light emitting layer for emitting blue light in a red pixel area, a green pixel area, and a blue pixel area, respectively. Alternatively, the organic light emitting display panel may be formed using a method of forming an organic light emitting layer for emitting white light in the red pixel area, the green pixel area, and the blue pixel area and forming a red color filter, a green color filter, and a blue color filter in the red pixel area, the green pixel area, and the blue pixel area, respectively.

SUMMARY

Exemplary embodiments of the invention may provide a display apparatus capable of preventing color mixing between adjacent light emitting areas and increasing light efficiency, and a method of manufacturing the same.

In an exemplary embodiment of the invention, a display apparatus includes a display panel including a base layer in which an active area and a peripheral area adjacent to the active area are defined, and a plurality of pixels which is disposed on the base layer to generate light and overlaps with the active area, and a cover panel including a window layer in which a transmission area overlapping with the active area and a bezel area adjacent to the transmission area are defined and which includes a rear surface facing the display panel and a front surface opposite to the rear surface, an optical filter layer disposed on the rear surface, and a color filter layer disposed on the optical filter layer and including quantum dots. The optical filter layer includes a partition layer in which an opening is defined and which includes an organic material, a light blocking layer disposed on the partition layer, and a reflective layer disposed in the opening. The light blocking layer includes a metal.

In an exemplary embodiment, the light blocking layer may expose a portion of a top surface, on which the light blocking layer is disposed, of the partition layer.

In an exemplary embodiment, the partition layer may have a matrix shape in a plan view, and the light blocking layer may have a shape corresponding to the matrix shape.

In an exemplary embodiment, the light blocking layer may further include a bottom facing the partition layer, a top opposite to the bottom, and a side connecting the bottom and the top. The side may be inclined with respect to the bottom.

In an exemplary embodiment, the opening may be provided in plural, the reflective layer may include first to third reflective patterns having different colors, and each of the first to third reflective patterns may be disposed in a corresponding one of the openings.

In an exemplary embodiment, one of the first to third reflective patterns may include the organic material of the partition layer.

In an exemplary embodiment, the partition layer and the reflective pattern including the organic material of the first to third reflective patterns may define the same plane.

In an exemplary embodiment, at least one of the first to third reflective patterns may cover a portion of each of the partition layer and the light blocking layer.

In an exemplary embodiment, the color filter layer may include first to third color patterns overlapping with the first to third reflective patterns, respectively, and one of the first to third color patterns may transmit the light provided from a corresponding one of the plurality of pixels.

In an exemplary embodiment, the display apparatus may further include a cover inorganic layer disposed on the color filter layer to partition the first to third color patterns.

In an exemplary embodiment, the display apparatus may further include a planarization layer disposed between the cover inorganic layer and the display panel to provide a flat surface.

In an exemplary embodiment, the light provided from the plurality of pixels may be blue light.

In an exemplary embodiment, each of the plurality of pixels may include a transistor and an organic light emitting element connected to the transistor. The organic light emitting element may include a first electrode connected to the transistor, a second electrode facing the first electrode, and an emission pattern disposed between the first electrode and the second electrode.

In an exemplary embodiment, each of the plurality of pixels may include a transistor and a liquid crystal display element connected to the transistor. The liquid crystal display element may include a first electrode connected to the transistor, a second electrode facing the first electrode, and a liquid crystal layer disposed between the first electrode and the second electrode.

In an exemplary embodiment, the light blocking layer may reflect light provided from the color filter layer toward the color filter layer.

In an exemplary embodiment, the display apparatus may further include at least one alignment key disposed on the bezel area. The at least one alignment key may include a same material as that of the light blocking layer.

In an exemplary embodiment, the at least one alignment key may be provided by a same process as that of the light blocking layer.

In an exemplary embodiment of the invention, a method of manufacturing a display apparatus includes providing a window layer including a transmission area and a bezel area adjacent to the transmission area on a work substrate, forming a partition layer having a plurality of openings on the window layer, forming a preliminary light blocking layer including a metal material on the window layer, forming a light blocking layer by patterning the preliminary light blocking layer disposed on the transmission area, forming an alignment key by patterning the preliminary light blocking layer disposed on the bezel area, forming reflective patterns having different colors in corresponding ones of the plurality of openings, and forming a color filter layer including quantum dots on the reflective patterns. The light blocking layer and the alignment key are provided by a same process.

In an exemplary embodiment, each of the reflective patterns may be aligned with a corresponding one of the openings by the alignment key.

In an exemplary embodiment, the light blocking layer may be disposed on the partition layer.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings:

FIGS. 9B to 9F are cross-sectional views illustrating an exemplary embodiment of a method of manufacturing a display apparatus according to the invention;

FIGS. 9H and 9I are cross-sectional views illustrating an exemplary embodiment of a method of manufacturing a display apparatus according to the invention.

DETAILED DESCRIPTION

Figure 1:
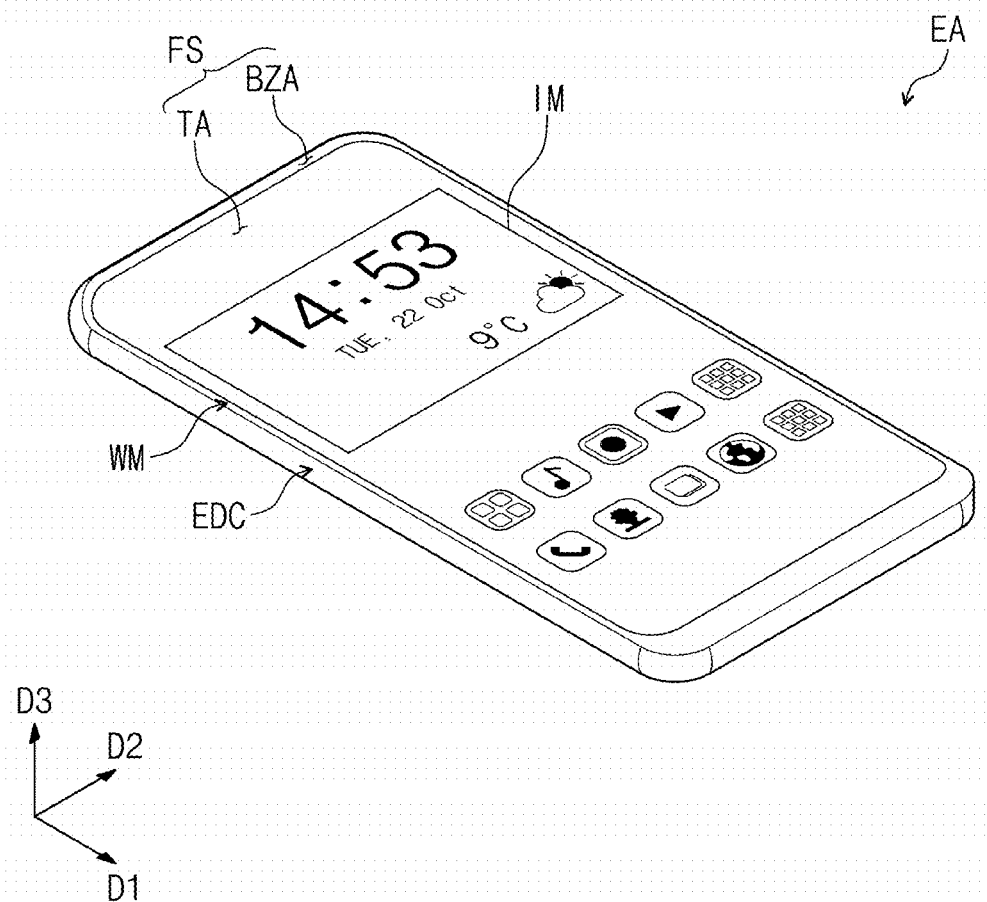
FIG. 1 is a perspective view illustrating an exemplary embodiment of a display apparatus according to the invention.

The invention now will be described more fully hereinafter with reference to the accompanying drawings, in which various embodiments are shown. The invention may, however, be embodied in many different forms, and should not be construed as limited to the exemplary embodiments set forth herein. Rather, these embodiments are provided so that this disclosure will be thorough and complete, and will fully convey the scopes of the invention to those skilled in the art. Like reference numerals refer to like elements throughout.

It will be understood that when an element such as a layer, region or substrate is referred to as being "on" another element, it can be directly on the other element or intervening elements may be present. In contrast, the term "directly" means that there are no intervening elements. As used herein, the term "and/or" includes any and all combinations of one or more of the associated listed items.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the drawing figures. It will be understood that the spatially relative terms are intended to encompass different orientations of the device in use or operation in addition to the orientation depicted in the drawing figures. For example, if the device in the drawing figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

Exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the drawing figures are schematic in nature and their shapes are not intended to illustrate the actual shape of a region of a device and are not intended to limit the scope of exemplary embodiments.

Hereinafter, exemplary embodiments of the invention will be described in detail with reference to the accompanying drawings.

Figure 2:
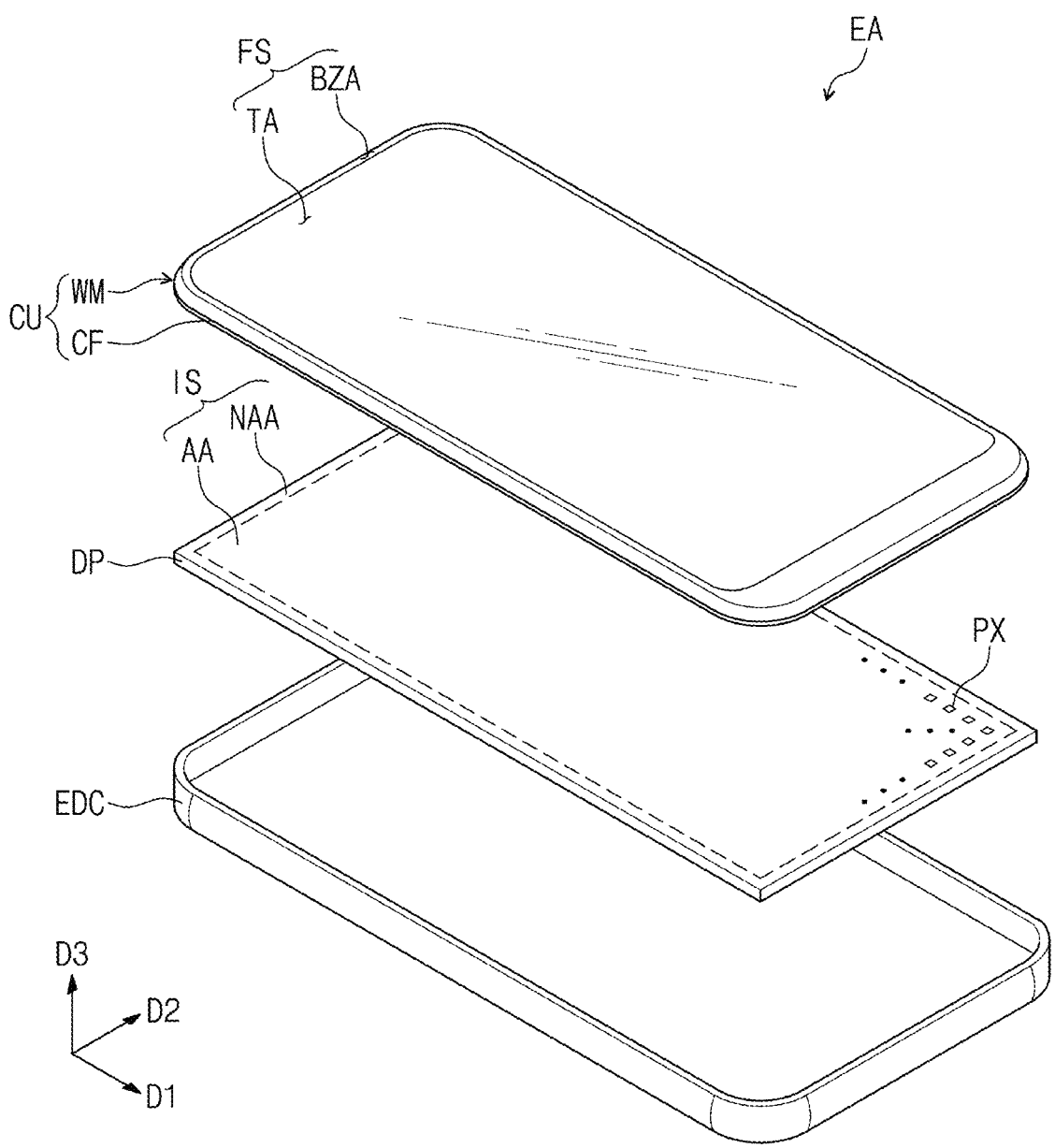
FIG. 2 is an exploded perspective view illustrating an exemplary embodiment of a display apparatus according to the invention.
Figure 3:
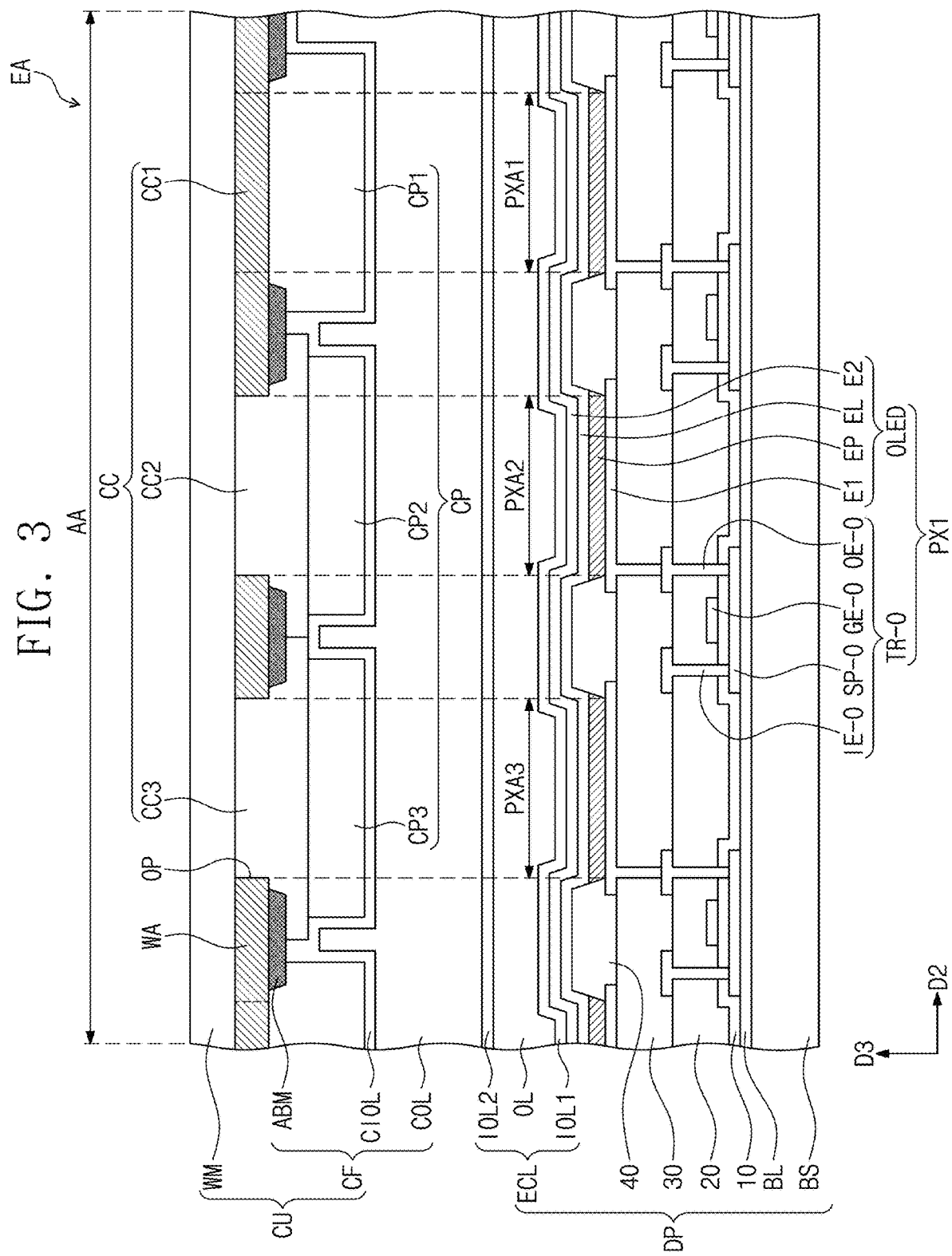
FIG. 3 is a cross-sectional view illustrating an exemplary embodiment of a display apparatus according to the invention.
Figure 4:
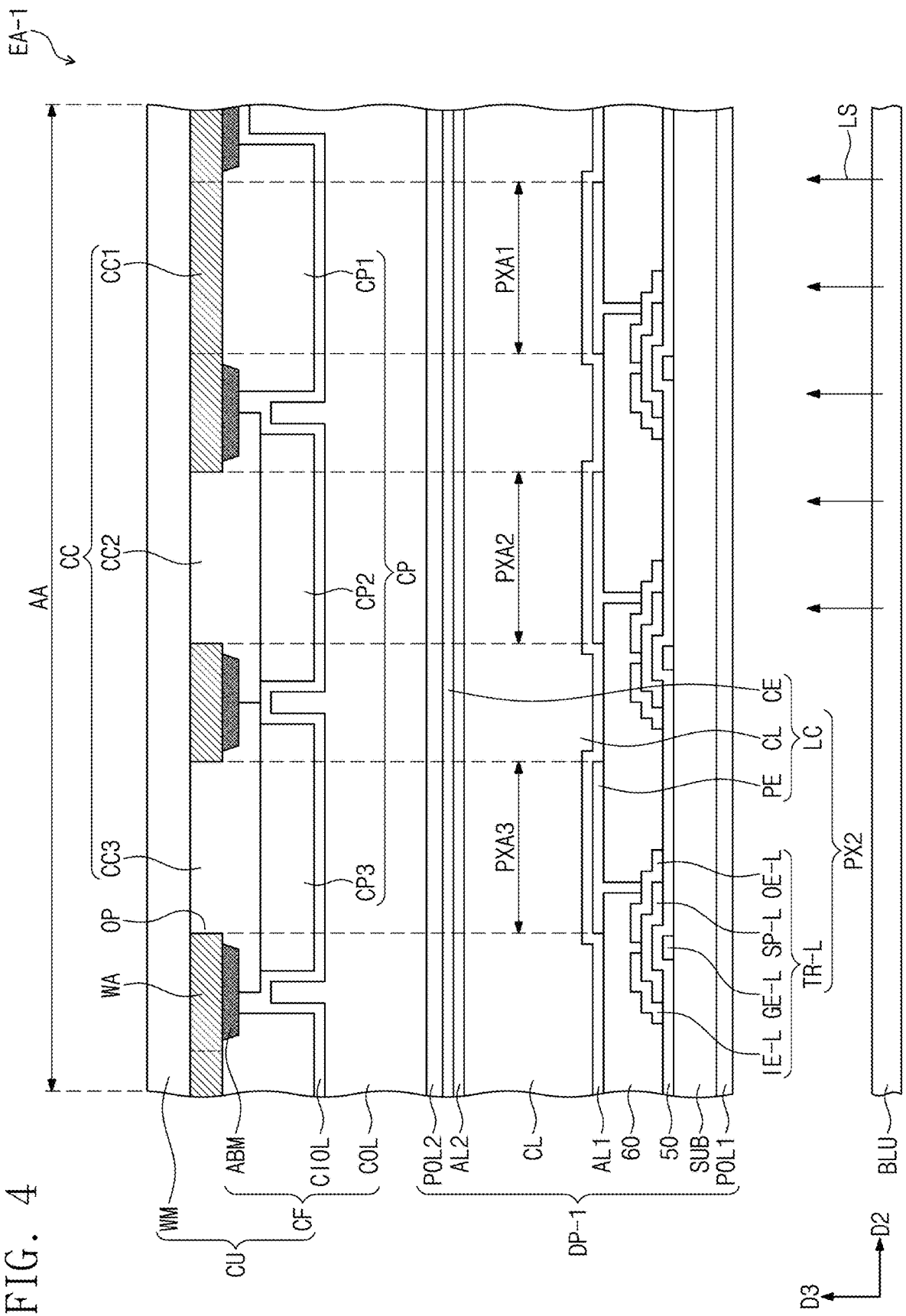
FIG. 4 is a cross-sectional view illustrating an exemplary embodiment of a display apparatus according to the invention.
Figure 5A:
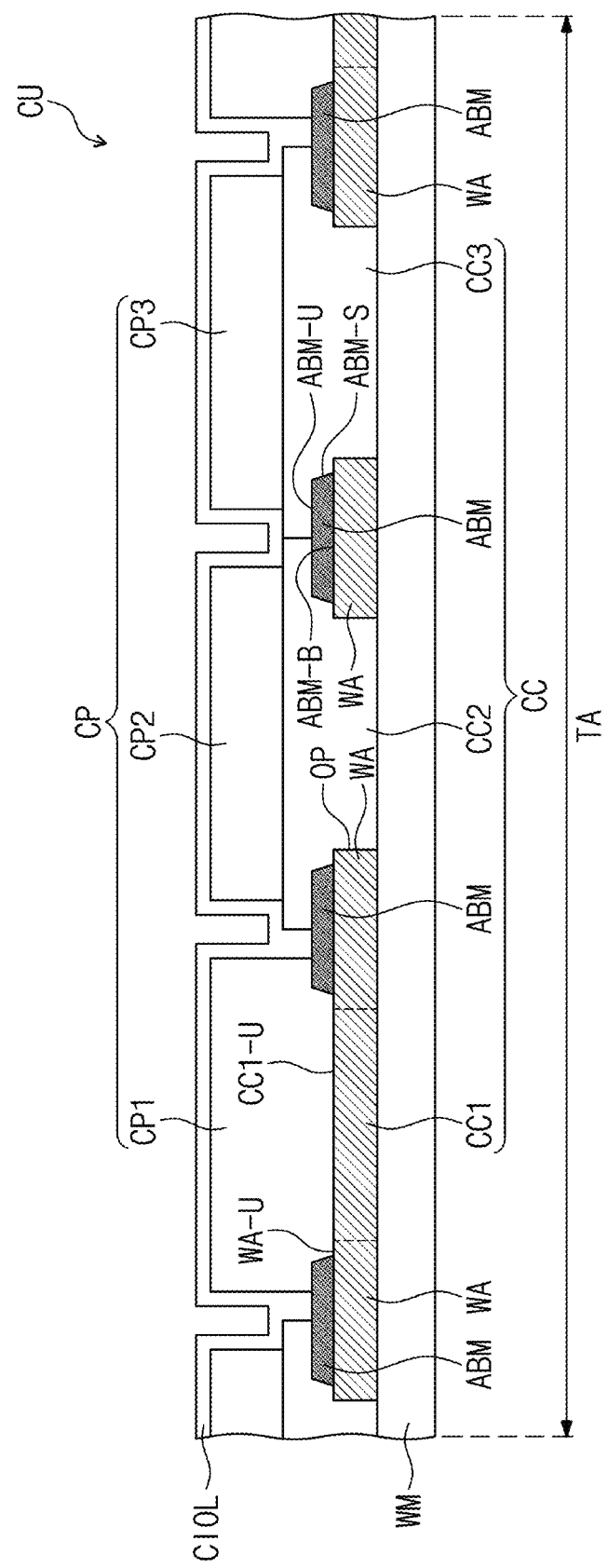
FIG. 5A is a cross-sectional view illustrating an exemplary embodiment of a cover panel according to the invention.
Figure 5B:
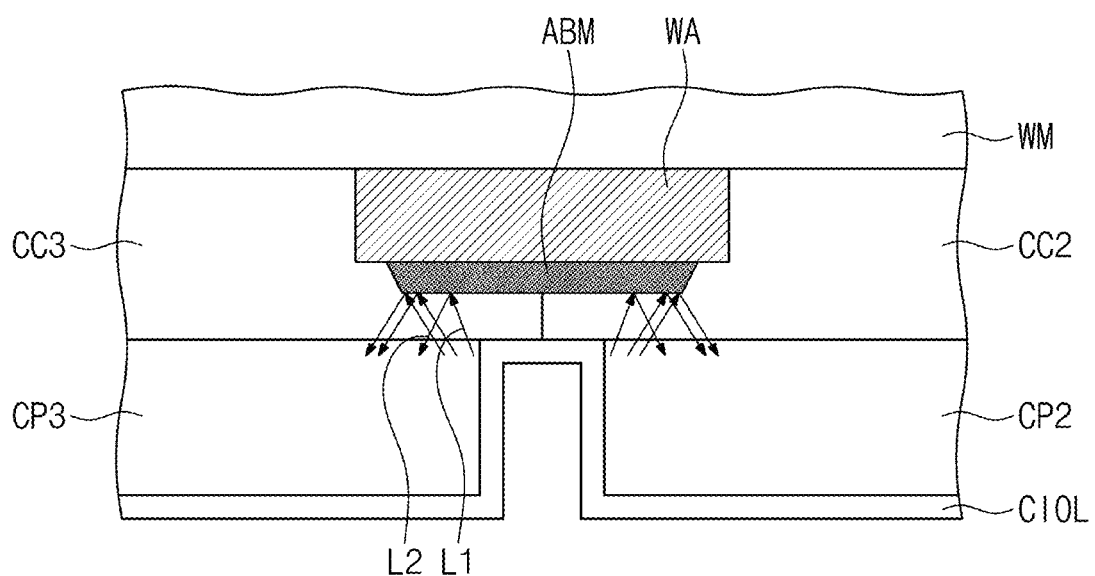
FIG. 5B is a cross-sectional view illustrating an exemplary embodiment of a cover panel according to the invention.
Figure 6:
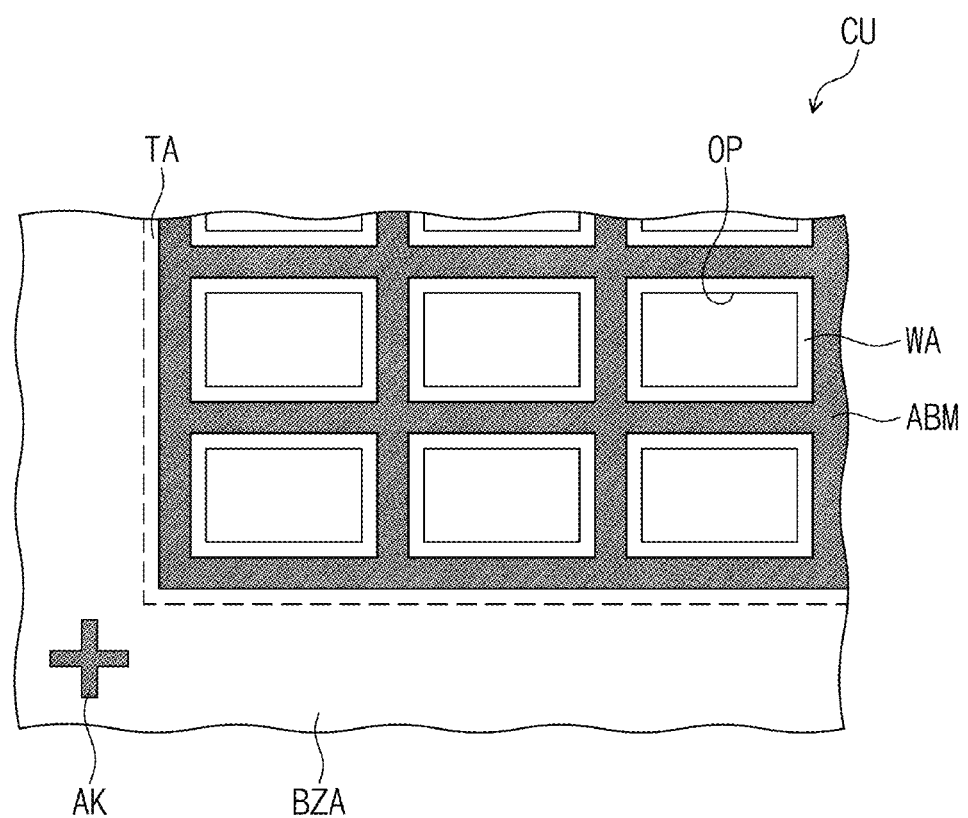
FIG. 6 is a plan view illustrating an exemplary embodiment of a cover panel according to the invention.

FIG. 1 is a perspective view illustrating an exemplary embodiment of a display apparatus according to the invention. FIG. 2 is an exploded perspective view illustrating an exemplary embodiment of a display apparatus according to the invention. FIG. 3 is a cross-sectional view illustrating an exemplary embodiment of a display apparatus according to the invention. FIG. 4 is a cross-sectional view illustrating an exemplary embodiment of a display apparatus according to the invention. FIG. 5A is a cross-sectional view illustrating an exemplary embodiment of a cover panel according to the invention. FIG. 5B is a cross-sectional view illustrating an exemplary embodiment of a cover panel according to the invention. FIG. 6 is a plan view illustrating an exemplary embodiment of a cover panel according to the invention.

Referring to FIGS. 1 and 2, a display apparatus EA may display an image IM in a plan view, defined by first and second directions D1 and D2, in a third direction D3. The display apparatus EA may include a cover panel CU, a display panel DP, and a cover case EDC.

The cover panel CU may include a window layer WM and an optical layer CF. The cover panel CU may be disposed on the display panel DP to cover a front surface IS of the display panel DP. The window layer WM may include a front surface FS exposed to the outside. An image displayed on the display panel DP may be visible to the outside through the front surface FS.

The window layer WM may have a single-layered or multi-layered structure. In an exemplary embodiment, the window layer WM may have a stack structure including a plurality of plastic films coupled to each other by an adhesive or may have a stack structure which includes a glass substrate and a plastic film coupled to each other by an adhesive, for example. The window layer WM may be optically transparent. In an exemplary embodiment, the window layer WM may include glass or plastic, for example.

The front surface FS of the window layer WM may be divided into a transmission area TA and a bezel area BZA in a plan view. The transmission area TA may transmit light provided from the display panel DP. The transmission area TA may have a shape corresponding to a shape of an active area AA of the display panel DP. In an exemplary embodiment, the transmission area TA may overlap with a whole or at least a portion of the active area AA, for example. Thus, the image IM displayed in the active area AA of the display panel DP may be visible to the outside through the transmission area TA.

A light transmittance of the bezel area BZA may be less than a light transmittance of the transmission area TA. The bezel area BZA may define a shape of the transmission area TA. The bezel area BZA may be adjacent to the transmission area TA and may have a closed-loop shape surrounding the transmission area TA in a plan view.

The bezel area BZA may have a predetermined color. The bezel area BZA may cover a peripheral area NAA of the display panel DP to prevent the peripheral area NAA from being visible to the outside. In an exemplary embodiment, when light generated in the display panel DP is leaked to the peripheral area NAA, the leaked light may be blocked by the bezel area BZA, and thus the peripheral area NAA may not be visible to the outside, for example.

The display panel DP may display the image IM on the front surface IS. The front surface IS may include the active area AA and the peripheral area NAA. The image IM may be displayed in the active area AA. The peripheral area NAA may be adjacent to the active area AA.

The display panel DP may include a plurality of pixels PX. Each of the pixels PX may display light in response to an electrical signal. Each of the pixels PX may generate light, and the lights of the pixels PX may form the image IM in the active area AA. The pixel PX in some exemplary embodiments of the invention may include a pixel PX1 (refer to FIG. 3) including an organic light emitting element OLED (refer to FIG. 3) or a pixel PX2 (refer to FIG. 3) including a liquid crystal display element LC.

The cover case EDC may be coupled to the cover panel CU. The cover case EDC may provide a rear surface of the display apparatus EA. The cover case EDC may be coupled to the cover panel CU to provide an inner space. Components of the display panel DP may be received in the inner space. The cover case EDC may include a material having a predetermined rigidity. In an exemplary embodiment, the cover case EDC may include a plurality of frames and/or plates, which include glass, plastic, and/or a metal, for example. The cover case EDC may stably protect components of the display apparatus EA received in the inner space from an external impact.

Referring to FIG. 3, an exemplary embodiment of the display apparatus EA may include the display panel DP and the cover panel CU. The display panel DP may include a base layer BS, insulating layers BL, 10, 20, 30 and 40, an encapsulation layer ECL, and a pixel PX1.

The base layer BS may be provided as a base layer on which components of the display panel DP are disposed. The base layer BS may include an insulating material. In an exemplary embodiment, the base layer BS may include glass, a resin film, or a stack film in which organic layers and inorganic layers are alternately stacked, for example.

The pixel PX1 may be provided in plural, each of the pixels PX1 may generate light, and the lights of the pixels PX1 may form the image IM in the active area AA. Each of the pixels PX1 may be connected to a plurality of signal lines (not shown). In an exemplary embodiment, the signal lines connected to each of the pixels PX1 may include a gate line and/or a data line, for example.

An auxiliary layer BL of the insulating layers may include an inorganic material. The auxiliary layer BL may include a barrier layer and/or a buffer layer. Thus, the auxiliary layer BL may prevent oxygen and/or moisture provided through the base layer BS from permeating into the pixel PX1 and/or may provide surface energy lower than surface energy of the base layer BS to stably form the pixel PX1.

At least one of the base layer BS and the auxiliary layer BL may be provided in plural, and the base layers BS and the auxiliary layers BL may be alternately stacked. In some exemplary embodiments, at least one of the barrier layer and the buffer layer of the auxiliary layer BL may be provided in plural or may be omitted. However, the invention is not limited thereto. In other exemplary embodiments, the structure of the display panel DP may be variously modified.

The pixel PX1 may include a first transistor TR-O and an organic light emitting element OLED. The first transistor TR-O may include a semiconductor pattern SP-O, a control electrode GE-O, an input electrode IE-O, and an output electrode OE-O.

The semiconductor pattern SP-O may be disposed on the auxiliary layer BL. The semiconductor pattern SP-O may include a semiconductor material. The control electrode GE-O may be spaced apart from the semiconductor pattern SP-O with a first insulating layer 10 interposed therebetween. The control electrode GE-O may include a conductive material. In an exemplary embodiment, the control electrode GE-O may include at least one of a metal (e.g., nickel (Ni), molybdenum (Mo), aluminum (Al), titanium (Ti), copper (Cu), and/or tungsten (W)) and a conductive metal oxide, for example.

The input electrode IE-O and the output electrode OE-O may be spaced apart from the control electrode GE-O with a second insulating layer 20 interposed therebetween. The input electrode IE-O and the output electrode OE-O may penetrate the first and second insulating layers 10 and 20 so as to be connected to one side portion and another side portion of the semiconductor pattern SP-O, respectively.

Each of the input electrode IE-O and the output electrode OE-O may include a conductive material. In an exemplary embodiment, each of the input electrode IE-O and the output electrode OE-O may include at least one of nickel (Ni), chromium (Cr), molybdenum (Mo), aluminum (Al), titanium (Ti), copper (Cu), tungsten (W), and any alloy thereof, for example. Each of the input electrode IE-O and the output electrode OE-O may have a single-layered or multi-layered structure.

A third insulating layer 30 may be disposed on the second insulating layer 20 to cover the input electrode IE-O and the output electrode OE-O. In another exemplary embodiment, the semiconductor pattern SP-O may be disposed on the control electrode GE-O. In still another exemplary embodiment, the semiconductor pattern SP-O may be disposed on the input electrode IE-O and the output electrode OE-O. In yet another exemplary embodiment, the input electrode IE-O and the output electrode OE-O may be disposed in the same layer as the semiconductor pattern SP-O and may be connected directly to the semiconductor pattern SP-O. Exemplary embodiments of the first transistor TR-O according to the invention may have any one of various structures and is not limited to a specific embodiment.

The organic light emitting element OLED may be disposed on the third insulating layer 30. The organic light emitting element OLED may include at least one of various elements capable of displaying and emitting light. The organic light emitting element OLED may include a first electrode E1, an emission pattern EP, a control layer EL, and a second electrode E2.

The first electrode E1 may penetrate the third insulating layer 30 so as to be connected to the first transistor TR-O. Even though not shown in the drawings, the display panel DP may further include a connection electrode disposed between the first electrode E1 and the first transistor TR-O. In this case, the first electrode E1 may be electrically connected to the first transistor TR-O through the connection electrode.

A fourth insulating layer 40 may be disposed on the third insulating layer 30. The fourth insulating layer 40 may include an organic material and/or an inorganic material and may have a single-layered or multi-layered structure. An opening may be defined in the fourth insulating layer 40. The opening may expose at least a portion of the first electrode E1. The fourth insulating layer 40 may be a pixel defining layer.

The emission pattern EP may be disposed in the opening defined in the fourth insulating layer 40. The emission pattern EP may be disposed on the first electrode E1 exposed by the opening. The emission pattern EP may include a light emitting material. In an exemplary embodiment, the emission pattern EP may include at least one of materials capable of emitting red light, green light and blue light, for example. In an exemplary embodiment, the emission pattern EP may include a fluorescent material or a phosphorescent material. The emission pattern EP may include an organic light emitting material or an inorganic light emitting material. The emission pattern EP may emit light in response to a potential difference between the first electrode E1 and the second electrode E2. An area overlapping with the emission pattern EP may be defined as a light emitting area. The plurality of pixels PX1 may have the light emitting areas, respectively. In FIG. 3, three light emitting areas PXA1, PXA2 and PXA3 are illustrated as an example.

The control layer EL may be disposed between the first electrode E1 and the second electrode E2. The control layer EL may be disposed adjacent to the emission pattern EP. The control layer EL may control movement of charges to improve luminous efficiency and life span of the organic light emitting element OLED. The control layer EL may include at least one of a hole transfer material, a hole injection material, an electron transfer material, and an electron injection material.

In the illustrated exemplary embodiment, the control layer EL is disposed between the emission pattern EP and the second electrode E2. However, the invention is not limited thereto. In other exemplary embodiments, the control layer EL may be disposed between the emission pattern EP and the first electrode E1, or the control layer EL may include a plurality of layers stacked in the third direction D3 with the emission pattern EP interposed therebetween. In still other exemplary embodiments, the control layer EL may be omitted in the organic light emitting element OLED. The control layer EL may have a single unitary body shape extending from the active area AA into the peripheral area NAA. The control layer EL may be provided in common in the plurality of pixels PX1.

The second electrode E2 may be disposed on the control layer EL. The second electrode E2 may be opposite to the first electrode E1. The second electrode E2 may have a single unitary body shape extending from the active area AA into the peripheral area NAA. The second electrode E2 may be provided in common in the plurality of pixels PX1. The organic light emitting element OLED disposed in each of the pixels PX1 may receive a common power source voltage through the second electrode E2.

The second electrode E2 may include a transparent conductive material or a semi-transparent conductive material. Thus, light generated from the emission pattern EP may easily exit in the third direction D3 through the second electrode E2. However, the invention is not limited thereto. In another exemplary embodiment, the first electrode E1 may include a transparent or semi-transparent conductive material, and the organic light emitting element OLED may be driven in a rear surface light emitting type. In still another exemplary embodiment, the organic light emitting element OLED may be driven in a both surface light emitting type in which light exits through a front surface and a rear surface.

The encapsulation layer ECL may be disposed on the organic light emitting element OLED to encapsulate the organic light emitting element OLED. The encapsulation layer ECL may be provided in common in the plurality of pixels PX1. Even though not shown in the drawings, a capping layer covering the second electrode E2 may be disposed between the second electrode E2 and the encapsulation layer ECL.

The encapsulation layer ECL may include a first inorganic layer IOL1, an organic layer OL and a second inorganic layer IOL2, which are sequentially stacked in the third direction D3. However, the invention is not limited thereto. In another exemplary embodiment, the encapsulation layer ECL may further include a plurality of inorganic layers and/or organic layers.

The first inorganic layer IOL1 may cover the second electrode E2. The first inorganic layer IOL1 may prevent external moisture and/or oxygen from permeating into the organic light emitting element OLED. In an exemplary embodiment, the first inorganic layer IOL1 may include silicon nitride, silicon oxide, silicon oxynitride, or a combination thereof, for example. The first inorganic layer IOL1 may be provided by a deposition process, for example.

The organic layer OL may be disposed on the first inorganic layer IOL1 and may be in contact with the first inorganic layer IOL1. The organic layer OL may provide a flat surface on the first inorganic layer IOL1. The organic layer OL may cover a bent portion of a top surface of the first inorganic layer IOL1 and/or a particle existing on the first inorganic layer IOL1, and thus it is possible to block the influence of the state of the top surface of the first inorganic layer IOL1 on components disposed on the organic layer OL.

In addition, the organic layer OL may relax or release stress between layers being in contact with the organic layer OL. The organic layer OL may include an organic material and may be provided by a solution process such as a spin coating process, a slit coating process, and/or an inkjet process.

The second inorganic layer IOL2 may be disposed on the organic layer OL to cover the organic layer OL. The second inorganic layer IOL2 may be stably disposed on a top surface of the organic layer OL, which is relatively flat as compared with the top surface of the first inorganic layer IOL1. The second inorganic layer IOL2 may encapsulate moisture outputted from the organic layer OL to prevent the moisture from being provided to the outside. In an exemplary embodiment, the second inorganic layer IOL2 may include silicon nitride, silicon oxide, silicon oxynitride, or a combination thereof, for example. The second inorganic layer IOL2 may be provided by a deposition process, for example.

According to an exemplary embodiment, the cover panel CU may be disposed on the encapsulation layer ECL. The cover panel CU may include a planarization layer COL disposed on the second inorganic layer IOL2.

The planarization layer COL may cover the encapsulation layer ECL providing a non-uniform front surface and may provide a flat surface in the active area AA. However, the invention is not limited thereto. In other exemplary embodiments of the cover panel CU, the planarization layer COL may be provided in plural or may be omitted.

Referring to FIG. 4, an exemplary embodiment of a display apparatus EA-1 may include a backlight unit BLU, a display panel DP-1, and a cover panel CU. The display panel DP-1 may include a base layer SUB, insulating layers 50 and 60, polarizing plates POL1 and POL2, alignment layers AL1 and AL2, and a pixel PX2.

The backlight unit BLU may provide light to the display panel DP-1. Light LS outputted from the backlight unit BLU may have a certain wavelength band. In an exemplary embodiment, the light LS may be ultraviolet ("UV") light or blue light, for example. Even though not shown in the drawings, when the light LS is outputted from a side surface of the backlight unit BLU, the display apparatus EA-1 may further include a light guide plate which guides the light LS to one surface of the base layer SUB, for example.

The base layer SUB may be provided as a base layer on which components of the display panel DP-1 are disposed. The base layer SUB may include an insulating material. In an exemplary embodiment, the base layer SUB may include glass, a resin film, or a stack film in which organic layers and inorganic layers are alternately stacked, for example.

The pixel PX2 may be provided in plural, each of the pixels PX2 may output light, and the lights of the pixels PX2 may form the image IM in the active area AA. Each of the pixels PX2 may be connected to a plurality of signal lines (not shown). In an exemplary embodiment, the signal lines connected to each of the pixels PX2 may include a gate line and/or a data line, for example.

The pixel PX2 may include a second transistor TR-L and a liquid crystal display element LC. The second transistor TR-L may include a control electrode GE-L, a semiconductor pattern SP-L, an input electrode IE-L, and an output electrode OE-L. The control electrode GE-L may be disposed on the base layer SUB. The control electrode GE-L may include a conductive material. In an exemplary embodiment, the control electrode GE-L may include at least one of a metal (e.g., nickel (Ni), molybdenum (Mo), aluminum (Al), titanium (Ti), copper (Cu), and/or tungsten (W)) and a conductive metal oxide, for example.

A first insulating layer 50 may be disposed on the base layer SUB and may cover the control electrode GE-L.

The semiconductor pattern SP-L may be disposed on the first insulating layer 50. The semiconductor pattern SP-L may include a semiconductor material. A portion of the semiconductor pattern SP-L may overlap with the control electrode GE-L. The input electrode IE-L and the output electrode OE-L may be disposed on the first insulating layer 50. One side portion of the input electrode IE-L may be connected to a corresponding data line (not shown), and another side portion of the input electrode IE-L may overlap with the semiconductor pattern SP-L. One side portion of the output electrode OE-L may overlap with the semiconductor pattern SP-L, and another side portion of the output electrode OE-L may be connected to a first electrode PE. The other side portion of the input electrode IE-L may be spaced apart from the one side portion of the output electrode OE-L.

Each of the input electrode IE-L and the output electrode OE-L may include a conductive material. In an exemplary embodiment, each of the input electrode IE-L and the output electrode OE-L may include at least one of nickel (Ni), chromium (Cr), molybdenum (Mo), aluminum (Al), titanium (Ti), copper (Cu), tungsten (W), and any alloy thereof, for example. Each of the input electrode IE-L and the output electrode OE-L may have a single-layered or multi-layered structure.

A second insulating layer 60 may be disposed on the first insulating layer 50. The second insulating layer 60 may cover the second transistor TR-L. The second insulating layer 60 may include an organic layer and/or an inorganic layer. The second insulating layer 60 may be a single layer or a multi-layer. In an exemplary embodiment, the second insulating layer 60 may include an inorganic layer disposed on the second transistor TR-L, and an organic layer disposed on the inorganic layer and providing a flat top surface, for example.

The first electrode PE (e.g., a pixel electrode) may be disposed on the second insulating layer 60. The first electrode PE may be electrically connected to the output electrode OE-L through a contact hole penetrating the second insulating layer 60. The first electrode PE may include a transparent conductive material. In an exemplary embodiment, the first electrode PE may include at least one of indium oxide, gallium oxide, titanium oxide, and zinc oxide, for example.

An area overlapping with the first electrode PE may be defined as a light emitting area. The plurality of pixels PX2 may have the light emitting areas, respectively. In FIG. 4, three light emitting areas PXA1, PXA2 and PXA3 are illustrated as an example.

A liquid crystal layer CL may include liquid crystal molecules having directionality. The liquid crystal molecules may be variously arranged depending on an electric field provided by a difference in voltage between the first electrode PE and a second electrode CE. The amount of light passing through the liquid crystal layer CL may be adjusted depending on the arrangement of the liquid crystal molecules.

The second electrode CE (e.g., a common electrode) may face the first electrode PE. The second electrode CE and the first electrode PE may constitute a liquid crystal capacitor. The second electrode CE may include a transparent conductive material. In an exemplary embodiment, the second electrode CE may include at least one of indium tin oxide ("ITO"), indium zinc oxide ("IZO"), indium gallium zinc oxide ("IGZO"), fluorine zinc oxide ("FZO"), gallium zinc oxide ("GZO"), and tin oxide ("TO"), for example.

Even though not shown in the drawings, the second electrode CE may be disposed on the base layer SUB in other exemplary embodiments. In these cases, the second electrode CE may be disposed in the same layer as the first electrode PE, or the second electrode CE and the first electrode PE may be disposed in different layers with at least one insulating layer interposed therebetween.

The display panel DP-1 may include a first alignment layer AL1 and a second alignment layer AL2. The first alignment layer AL1 may be disposed between the first electrode PE and the liquid crystal layer CL, and the second alignment layer AL2 may be disposed between the liquid crystal layer CL and the second electrode CE. The first and second alignment layers AL1 and AL2 may align the liquid crystal molecules of the liquid crystal layer CL. The first and second alignment layers AL1 and AL2 may be vertical alignment layers and may include polyamic acid, polysiloxane, and/or polyimide.

The display panel DP-1 may include at least one polarizing plate POL1 and/or POL2. In an exemplary embodiment, a first polarizing plate POL1 and a second polarizing plate POL2 may polarize light provided from the backlight unit BLU, for example. The first polarizing plate POL1 may face the backlight unit BLU. The second polarizing plate POL2 may be disposed on the second electrode CE. Each of the polarizing plates POL1 and POL2 may include a plurality of patterns for polarizing incident light or may have a structure in which inorganic layers are stacked. In an exemplary embodiment, each of the polarizing plates POL1 and POL2 may include a wire grid polarizer, a distributed Bragg reflector, and/or a polarizing film, for example.

According to an exemplary embodiment, the cover panel CU may be disposed on the second polarizing plate POL2. The cover panel CU may include a planarization layer COL disposed on the second polarizing plate POL2.

The planarization layer COL may cover the second polarizing plate POL2 and may provide a flat surface in the active area AA. However, the invention is not limited thereto. In other exemplary embodiments of the cover panel CU, the planarization layer COL may be provided in plural or may be omitted.

FIGS. 5A and 5B separately illustrate the cover panel CU disposed on the display panel DP or DP-1. The planarization layer COL of the cover panel CU is omitted in FIGS. 5A and 5B for the purpose of ease and convenience in description and illustration.

The cover panel CU may be disposed on the display panel DP or DP-1. The cover panel CU may include the window layer WM and the optical layer CF (refer to FIGS. 3 and 4).

The optical layer CF may include a partition layer WA, a reflective layer CC, a light blocking layer ABM, and a color filter layer CP, which are disposed in the transmission area TA. In addition, the optical layer CF may include an alignment key AK (refer to FIG. 6) disposed in the bezel area BZA (refer to FIG. 6).

In an exemplary embodiment of the invention, the partition layer WA, the reflective layer CC and the light blocking layer ABM may be defined as an optical filter layer.

The partition layer WA of the optical filter layer may be disposed on the window layer WM. In an exemplary embodiment, the partition layer WA may be disposed on a rear surface of the window layer WM, i.e., a surface of the window layer WM which faces the display panel DP or DP-1, for example. The partition layer WA may be disposed on the rear surface of the window layer WM to prevent the components of the display panel DP or DP-1 from being visible by light provided from the outside to the front surface of the window layer WM. The partition layer WA may include an organic material capable of blocking light. The partition layer WA may have a predetermined color. In an exemplary embodiment, the partition layer WA may have a blue color, for example.

A plurality of openings OP may be defined in the partition layer WA. Portions of the rear surface of the window layer WM may be exposed through the openings OP of the partition layer WA. The openings OP may overlap with the light emitting areas PXA1, PXA2 and PXA3 (refer to FIGS. 3 and 4) of the display panel DP or DP-1, respectively. In an exemplary embodiment, the opening OP may overlap with the emission pattern EP of the organic light emitting element OLED of FIG. 3, for example. In an alternative exemplary embodiment, the opening OP may overlap with the first electrode PE (i.e., the pixel electrode) of the liquid crystal display element LC of FIG. 4.

The reflective layer CC of the optical filter layer may be disposed on the rear surface of the window layer WM. The reflective layer CC and the partition layer WA may prevent the components of the display panel DP or DP-1 from being visible by light provided from the outside.

The reflective layer CC may include first to third reflective patterns CC1, CC2 and CC3. Each of the first to third reflective patterns CC1, CC2 and CC3 may be disposed in a corresponding one of the openings OP. Each of the first to third reflective patterns CC1, CC2 and CC3 may overlap with a corresponding one of the light emitting areas PXA1, PXA2 and PXA3 of the display panel DP or DP-1.

The first to third reflective patterns CC1, CC2 and CC3 may block and/or transmit lights of different colors. In an exemplary embodiment, the first reflective pattern CC1 may transmit only blue light, and the second reflective pattern CC2 may block the blue light but may transmit only red light, for example. In an exemplary embodiment, the third reflective pattern CC3 may block the blue light but may transmit only green light, for example.

The first to third reflective patterns CC1, CC2 and CC3 may include organic materials capable of transmitting lights of different colors. The first to third reflective patterns CC1, CC2 and CC3 may have different colors. In an exemplary embodiment, the first reflective pattern CC1 may have a blue color, the second reflective pattern CC2 may have a red color, and the third reflective pattern CC3 may have a green color, for example.

In an exemplary embodiment, the first reflective pattern CC1 may be provided by the same process as that of the partition layer WA. Thus, the first reflective pattern CC1 may include the same material as that of the partition layer WA and may have the same color as that of the partition layer WA. In addition, a top surface CC1-U of the first reflective pattern CC1 may be coplanar with a top surface WA-U of the partition layer WA.

In an exemplary embodiment, the partition layer WA may have different widths in a cross-sectional view. In an exemplary embodiment, the first reflective pattern CC1 may be a pattern substantially continuous with the partition layer WA, and thus a width, in one direction, of the partition layer WA in which the first reflective pattern CC1 is disposed may be greater than a width, in the one direction, of the partition layer WA disposed between the second and third reflective patterns CC2 and CC3, for example.

In an exemplary embodiment, a shape of the first reflective pattern CC1 may be different from those of the second and third reflective patterns CC2 and CC3 in a plan view. In an exemplary embodiment, the top surface CC1-U of the first reflective pattern CC1 may be coplanar with the top surface WA-U of the partition layer WA, for example. On the contrary, each of the second and third reflective patterns CC2 and CC3 may cover portions of the partition layer WA and the light blocking layer ABM. In addition, one side of the second reflective pattern CC2 may be in contact with one side of the third reflective pattern CC3 adjacent thereto.

The light blocking layer ABM of the optical filter layer may be disposed on the partition layer WA. The partition layer WA may not overlap with the light emitting areas PXA1, PXA2 and PXA3 of the display panel DP or DP-1.

The light blocking layer ABM may include a bottom ABM-B facing the partition layer WA, a top ABM-U opposite to the bottom ABM-B, and a side ABM-S connecting the bottom ABM-B and the top ABM-U. In an exemplary embodiment, the side ABM-S may be inclined with respect to the bottom ABM-B. Thus, the light blocking layer ABM may have a tapered shape in a cross-sectional view. However, the invention is not limited thereto. In another exemplary embodiment, the side ABM-S may vertically extend from the bottom ABM-B so as to be connected to the top ABM-U.

The maximum width of the light blocking layer ABM in the second direction D2 may be less than a width of the partition layer WA in the second direction D2. Thus, the light blocking layer ABM may expose a portion of a top surface of the partition layer WA on which the light blocking layer ABM is disposed.

The light blocking layer ABM may be disposed between the light emitting areas PXA1, PXA2 and PXA3 to absorb light leaked to neighboring light emitting areas. The light blocking layer ABM may include a material which does not transmit light. In an exemplary embodiment, the light blocking layer ABM may include a metal (e.g., chromium (Cr), copper (Cu), silver (Ag), molybdenum (Mo), nickel (Ni), titanium (Ti), and/or tantalum (Ta)), a metal oxide, or an organic material, for example. The light blocking layer ABM may be disposed between the light emitting areas PXA1, PXA2 and PXA3 of the display panel DP or DP-1 to prevent color mixing between the light emitting areas PXA1, PXA2 and PXA3.

The color filter layer CP may improve color reproducibility of light provided from the display panel DP or DP-1. The color filter layer CP may include first to third color patterns CP1, CP2 and CP3. The first to third color patterns CP1, CP2 and CP3 may overlap with the first to third reflective patterns CC1, CC2 and CC3, respectively. In an exemplary embodiment, the first color pattern CP1 may be disposed on the first reflective pattern CC1. The second color pattern CP2 may be disposed on the second reflective pattern CC2, and the third color pattern CP3 may be disposed on the third reflective pattern CC3, for example.

In an exemplary embodiment, the first color pattern CP1 may display the same color as that of light supplied from the display panel DP or DP-1. In an exemplary embodiment, blue light provided from the display panel DP or DP-1 may pass through the first color pattern CP1 without being converted or changed, for example. The first color pattern CP1 corresponding to an area emitting blue light may include a material capable of outputting incident blue light without phosphors or quantum dots. The first color pattern CP1 may further include a scatterer. In an exemplary embodiment, the first color pattern CP1 may include at least one of titanium oxide ($TiO_2$), a polymer (e.g., a photosensitive resin), a blue dye, and a blue pigment, for example. However, the invention is not limited thereto. The first color pattern CP1 may include at least one of other various materials which do not convert the blue light but scatter the blue light.

Each of the second and third color patterns CP2 and CP3 may include a plurality of quantum dots for converting light. In this case, the quantum dots may include a group II-VI compound, a group III-V compound, a group IV-VI compound, a group IV element, a group IV compound, or any combination thereof. The group II-VI compound may be selected from a group including a binary compound including CdSe, CdTe, ZnS, ZnSe, ZnTe, ZnO, HgS, HgSe, HgTe, MgSe, MgS, and any combination thereof, a ternary compound including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any combination thereof, and a quaternary compound including HgZnTeS, CdZnSeS, CdZnSeTe, CdZnSTe, CdHgSeS, CdHgSeTe, CdHgSTe, HgZnSeS, HgZnSeTe, HgZnSTe, and any combination thereof. The group III-V compound may include a binary compound including GaN, GaP, GaAs, GaSb, AlN, AlP, AlAs, AlSb, InN, InP, InAs, InSb, and any combination thereof, a ternary compound including GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and any combination thereof, and a quaternary compound including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any combination thereof. The group IV-VI compound may include a binary compound including SnS, SnSe, SnTe, PbS, PbSe, PbTe, and any combination thereof, a ternary compound including SnSeS, SnSeTe, SnSTe, PbSeS, PbSeTe, PbSTe, SnPbS, SnPbSe, SnPbTe, and any combination thereof, and a quaternary compound including SnPbSSe, SnPbSeTe, SnPbSTe, and any combination thereof. The group IV element may include silicon (Si), germanium (Ge), and a combination thereof. The group IV compound may be a binary compound including silicon carbide (SiC), silicon-germanium (SiGe), and a combination thereof. In addition, shapes of the quantum dots may be shapes generally used in the art and are not particularly limited. In an exemplary embodiment, the quantum dot may have a spherical shape, a pyramidal shape, a multi-arm shape, a cubic nanoparticle shape, a nanotube shape, a nanowire shape, a nanofiber shape, or a nano-plate particle shape, for example. In certain exemplary embodiments, each of the second and third color patterns CP2 and CP3 may include a plurality of phosphors capable of converting incident light into light having a different color from that of the incident light. In an exemplary embodiment, the second color pattern CP2 may include a plurality of phosphors which absorbs blue light provided from the display panel DP or DP-1 and emits red light, for example. In an exemplary embodiment, the red phosphors may include at least one of (Ca, Sr, Ba)S, (Ca, Sr, Ba)$_2$Si$_5$N$_8$, CaAlSiN$_3$, CaMoO$_4$, and Eu$_2$Si$_5$N$_8$, for example. The third color pattern CP3 may include phosphors which absorb the blue light provided from the display panel DP or DP-1 and emit green light. In an exemplary embodiment, the green phosphors may include at least one of yttrium aluminum garnet ("YAG"), (Ca, Sr, Ba)$_2$SiO$_4$, SrGa$_2$S$_4$, BAM, α-SiAlON, β-SiAlON, Ca$_3$Sc$_2$Si$_3$O$_{12}$, Tb$_3$Al$_5$O$_{12}$, BaSiO$_4$, CaAlSiON, and (Sr$_{1-x}$Ba$_x$)Si$_2$O$_2$N$_2$, for example.

In an exemplary embodiment, the cover panel CU may further include a cover inorganic layer CIOL. The cover inorganic layer CIOL may be disposed on the whole of the rear surface of the window layer WM. The cover inorganic layer CIOL may be disposed on the color filter layer CP to partition the first to third color patterns CP1, CP2 and CP3. The cover inorganic layer CIOL may include at least one of silicon oxide (SiO$_x$) and silicon nitride (SiN$_x$), for example. The cover inorganic layer CIOL may prevent oxygen and/or moisture from permeating into the color filter layer CP.

Referring to FIG. 5B, when the light blocking layer ABM includes a metal or a metal oxide, the light blocking layer ABM may reflect lights provided from adjacent light emitting areas PXA1, PXA2 and PXA3 (refer to FIGS. 3 and 4) through the color filter layer CP.

In an exemplary embodiment, when first light L1 provided from the third color pattern CP3 is incident to the light blocking layer ABM, the light blocking layer ABM may reflect the first light L1 to form a light path of second light L2 traveling again toward the third color pattern CP3, for example.

Since the light blocking layer ABM includes a metal element, color mixing between the adjacent light emitting areas PXA1, PXA2 and PXA3 may be prevented. In addition, the light blocking layer ABM may reflect light leaked to the adjacent light emitting areas PXA1, PXA2 and PXA3 and may provide the reflected light to a corresponding light emitting area, and thus the display apparatus EA or EA-1 with improved luminous efficiency may be provided or realized.

Referring to FIG. 6, the partition layer WA may have a matrix shape or a mesh shape in a plan view. In addition, the light blocking layer ABM may have a matrix shape or mesh shape corresponding to the partition layer WA in a plan view. In an exemplary embodiment, the openings OP of the partition layer WA may be arranged in a matrix form, for example.

In FIG. 6, each of the openings OP arranged in the matrix form has a rectangular shape. However, the invention is not limited thereto. In other exemplary embodiments, shapes and widths of the openings OP may be variously modified, and/or the openings OP may have different shapes and/or different widths.

In an exemplary embodiment, the cover panel CU may include the alignment key AK, as described above. The alignment key AK may be disposed in the bezel area BZA. The alignment key AK may have a cross (+) shape in a plan view.

The alignment key AK may be provided by the same process as that of the light blocking layer ABM. Thus, the alignment key AK and the light blocking layer ABM may include the same material. In addition, the alignment key AK and the light blocking layer ABM may have the same thickness.

The alignment key AK may be used as a reference point for checking areas, in which organic layers disposed on the light blocking layer ABM are discharged, in a process of manufacturing the cover panel CU. In an exemplary embodiment, each of the second and third reflective patterns CC2 and CC3 may be discharged to a corresponding one of the openings OP by the alignment key AK, for example. In addition, the first to third color patterns CP1, CP2 and CP3 overlapping with the first to third reflective patterns CC1, CC2 and CC3, respectively, may also be provided using the alignment key AK.

Since the alignment key AK includes at least one of a metal and a metal oxide, it may be easily distinguished by the naked eye in a process. Thus, the organic layers disposed on the window layer WM may be easily disposed at desired positions. Thus, the display apparatus EA or EA-1 with improved reliability may be provided or realized.

In addition, since the light blocking layer ABM and the alignment key AK are provided by the same process, a process cost and a process time may be reduced.

Figure 7:
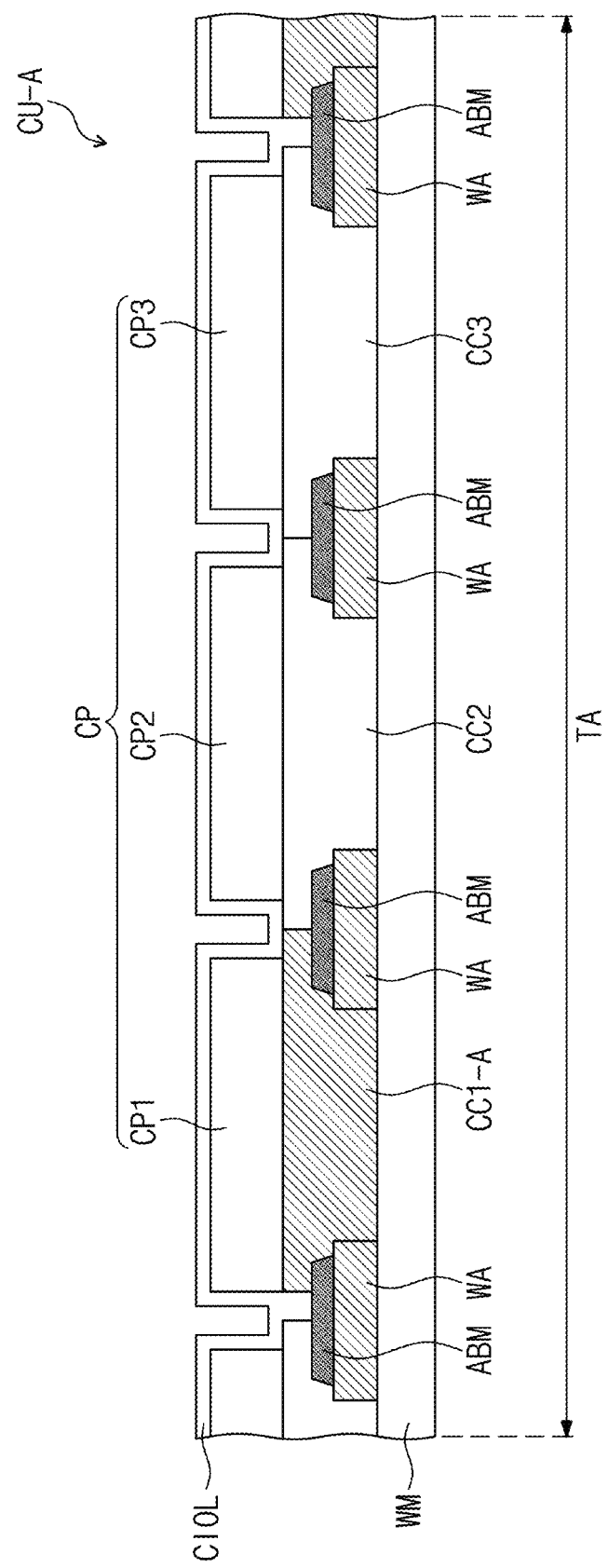
FIG. 7 is a cross-sectional view illustrating an exemplary embodiment of a cover panel according to the invention.

FIG. 7 is a cross-sectional view illustrating an exemplary embodiment of a cover panel according to the invention. Hereinafter, the same or similar components as in FIGS. 1 to 6 will be indicated by the same or similar reference designators, and the descriptions to the same features as in the exemplary embodiments of FIGS. 1 to 6 will be omitted.

Referring to FIG. 7, a first reflective pattern CC1-A of a cover panel CU-A in an exemplary embodiment may cover portions of the partition layer WA and the light blocking layer ABM, unlike the first reflective pattern CC1 of FIG. 5A. In addition, one side of the first reflective pattern CC1-A may be in contact with one side of the second reflective pattern CC2 adjacent thereto. Thus, top surfaces of the first to third reflective patterns CC1-A, CC2 and CC3 may define the same plane.

Figure 8A:
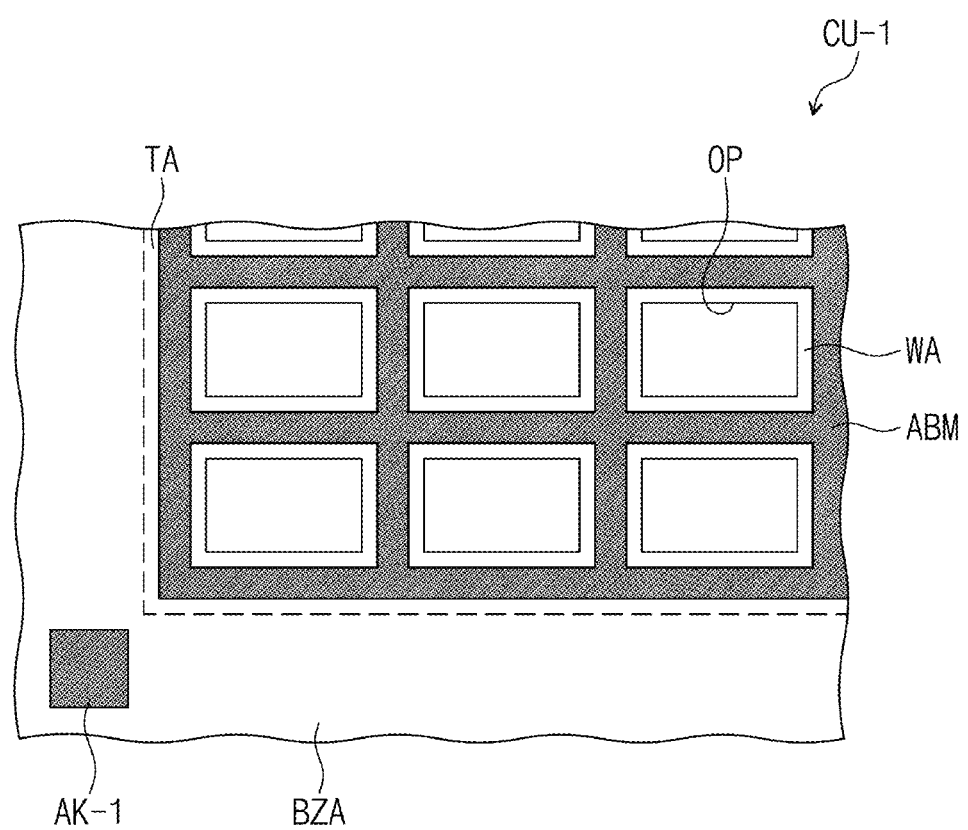
FIGS. 8A and 8B are plan views illustrating an exemplary embodiment of cover panels according to the invention.
Figure 8B:
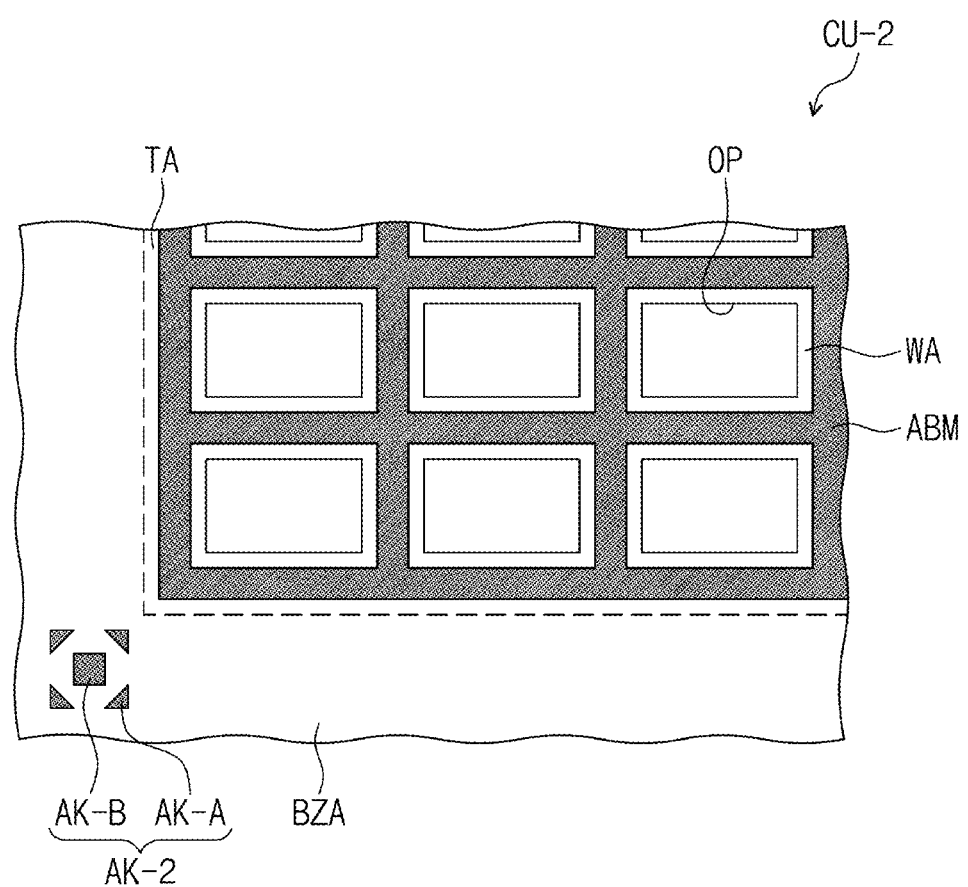

FIGS. 8A and 8B are plan views illustrating cover panels in some exemplary embodiments of the invention. Hereinafter, the same or similar components as in FIGS. 1 to 6 will be indicated by the same or similar reference designators, and the descriptions to the same features as in the exemplary embodiments of FIGS. 1 to 6 will be omitted.

Referring to FIG. 8A, an alignment key AK-1 of cover panel CU-1 may be provided by the same process as that of the light blocking layer ABM. The alignment key AK-1 may be disposed in the bezel area BZA. The alignment key AK-1 may include the same material as that of the light blocking layer ABM. In an exemplary embodiment, the alignment key AK-1 may include at least one of a metal and a metal oxide, for example.

In an exemplary embodiment, the alignment key AK-1 may have a quadrilateral shape in a plan view. However, the invention is not limited thereto. In other exemplary embodiments, the alignment key AK-1 may have a polygonal shape or a circular shape in a plan view.

Referring to FIG. 8B, an alignment key AK-2 of cover panel CU-2 may be provided by the same process as that of the light blocking layer ABM. The alignment key AK-2 may be disposed in the bezel area BZA. The alignment key AK-2 may include the same material as that of the light blocking layer ABM. In an exemplary embodiment, the alignment key AK-2 may include at least one of a metal and a metal oxide, for example.

In an exemplary embodiment, the alignment key AK-2 may include a plurality of first sub-keys AK-A and a second sub-key AK-B. Each of the first sub-keys AK-A may have a triangular shape in a plan view. The first sub-keys AK-A may be disposed to surround the second sub-key AK-B in a plan view. The second sub-key AK-B may have a quadrilateral shape in a plan view. One side of each of the first sub-keys AK-A may face one corner of the second sub-key AK-B. In an exemplary embodiment, the second sub-key AK-B having the quadrilateral shape may have four corners, and one side of each of the first sub-keys AK-A having the triangular shapes may face each of the corners of the second sub-key AK-B, for example. However, the shapes of the first and second sub-keys AK-A and AK-B are not limited thereto. In other exemplary embodiments, the first and second sub-keys AK-A and AK-B may have polygonal shapes.

Figure 9A:
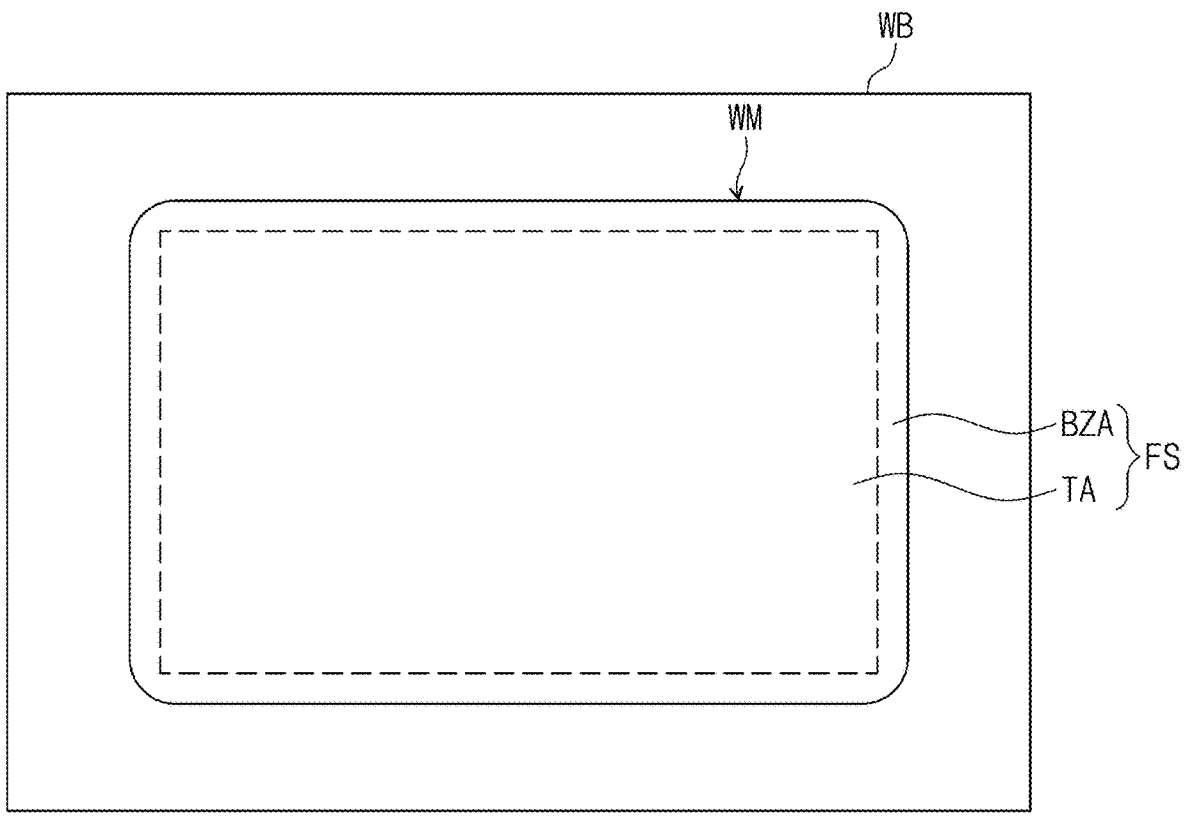
FIG. 9A is a plan view illustrating an exemplary embodiment of a method of manufacturing a display apparatus according to the invention.

FIG. 9A is a plan view illustrating an exemplary embodiment of a method of manufacturing a display apparatus according to the invention. FIGS. 9B to 9F are cross-sectional views illustrating an exemplary embodiment of a method of manufacturing a display apparatus according to the invention. Hereinafter, the same or similar components as in FIGS. 1 to 6 will be indicated by the same or similar reference designators, and the descriptions to the same features as in the exemplary embodiments of FIGS. 1 to 6 will be omitted.

Referring to FIG. 9A, an exemplary embodiment of a method of manufacturing a display apparatus may include providing a window layer WM. The window layer WM may be disposed on a work substrate WB. The window layer WM may include a transmission area TA and a bezel area BZA.

Figure 9B:
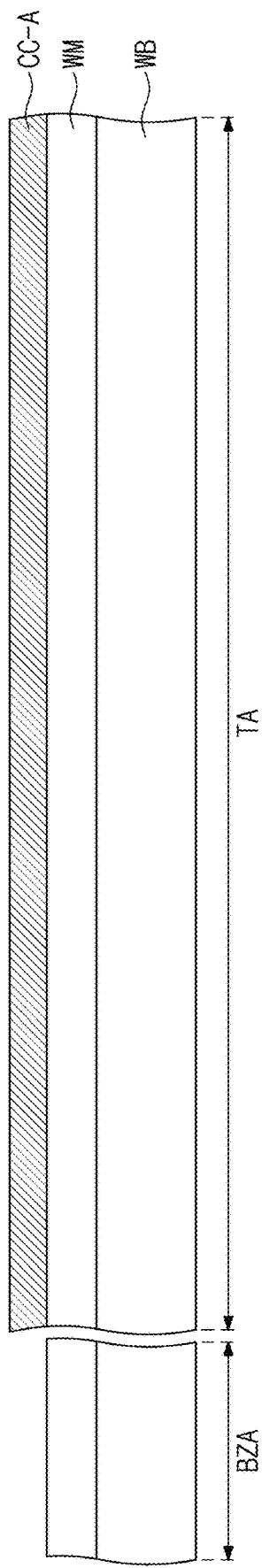

Referring to FIG. 9B, subsequently, the manufacturing method may include forming a preliminary partition layer CC-A. The preliminary partition layer CC-A may be coated or deposited on a rear surface of the window layer WM of the transmission area TA. The preliminary partition layer CC-A may include an organic material capable of blocking light. The preliminary partition layer CC-A may have a predetermined color. In an exemplary embodiment, the preliminary partition layer CC-A may have a blue color, for example.

Figure 9C:
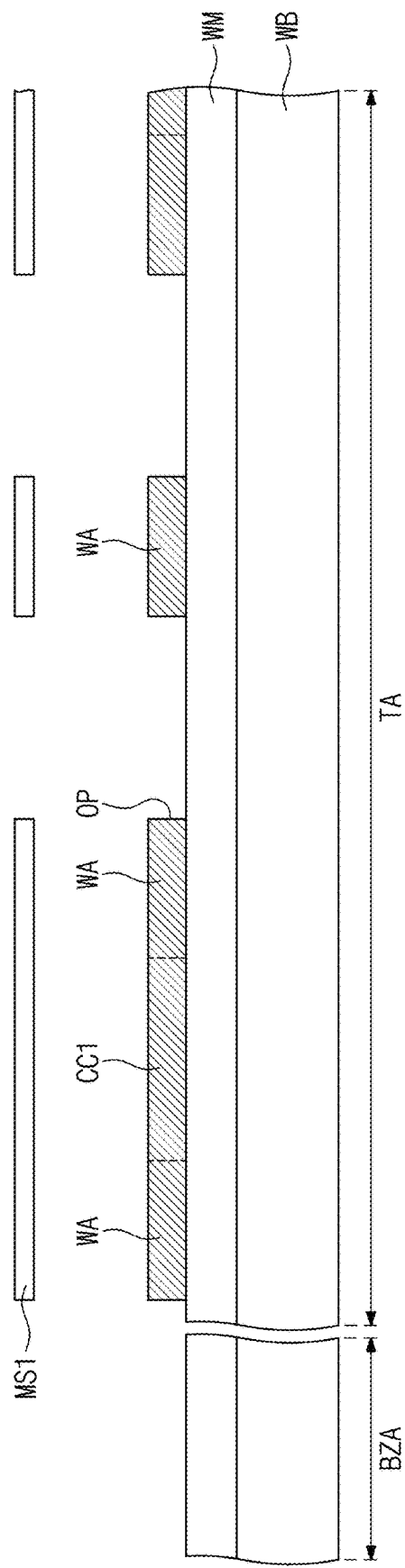

Referring to FIG. 9C, thereafter, the manufacturing method may include forming a partition layer WA. A photolithography process using a first mask MS1 may be performed on the preliminary partition layer CC-A to form the partition layer WA. Openings OP penetrating the partition layer WA may be defined in the partition layer WA. The openings OP may expose portions of the rear surface of the window layer WM.

Referring to FIG. 9D, next, the manufacturing method may include forming a preliminary light blocking layer BMA. The preliminary light blocking layer BMA may be provided to cover the rear surface of the window layer WM of the transmission area TA and the bezel area BZA. The preliminary light blocking layer BMA may include a metal material. The preliminary light blocking layer BMA may be provided by a sputtering process.

Referring to FIG. 9E, thereafter, the manufacturing method may include forming a light blocking layer ABM. The light blocking layer ABM may be provided by patterning the preliminary light blocking layer BMA of the transmission area TA. The patterning process may be performed by an etching process using a second mask MS2. In an exemplary embodiment, the light blocking layer ABM may be disposed on the partition layer WA. The light blocking layer ABM may be spaced apart from the openings OP of the partition layer WA.

In an exemplary embodiment, the method of manufacturing the display apparatus may include forming an alignment key AK. The alignment key AK may be provided by patterning the preliminary light blocking layer BMA disposed on the bezel area BZA. The patterning process may be performed by the etching process using the second mask MS2.

The light blocking layer ABM and the alignment key AK may be provided by the same process. In other words, the light blocking layer ABM and the alignment key AK may be disposed at the same time by the etching process using the second mask MS2. Thus, the light blocking layer ABM and the alignment key AK may include the same material and may have the same thickness.

Figure 9F:
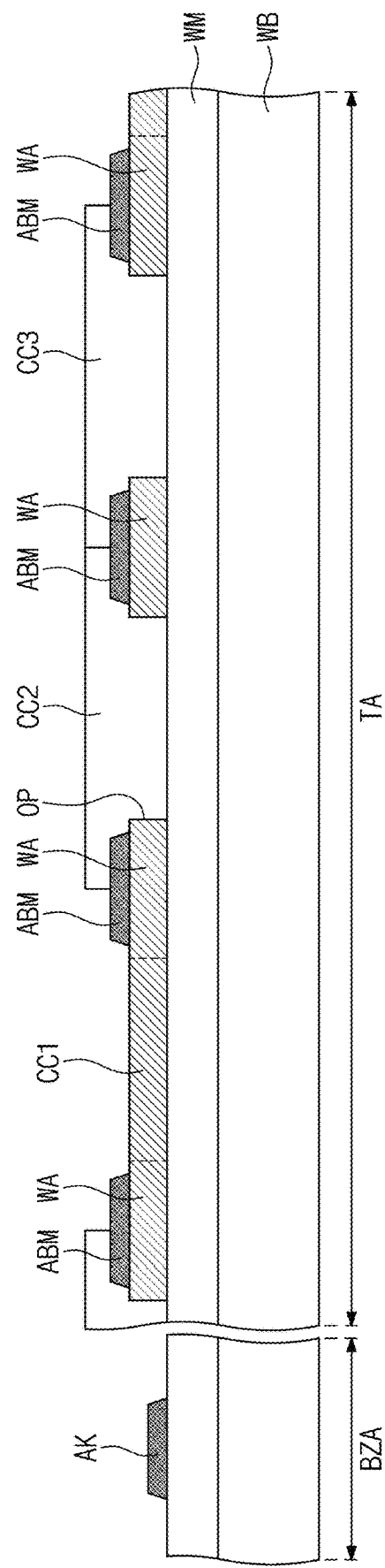
Figure 9G:
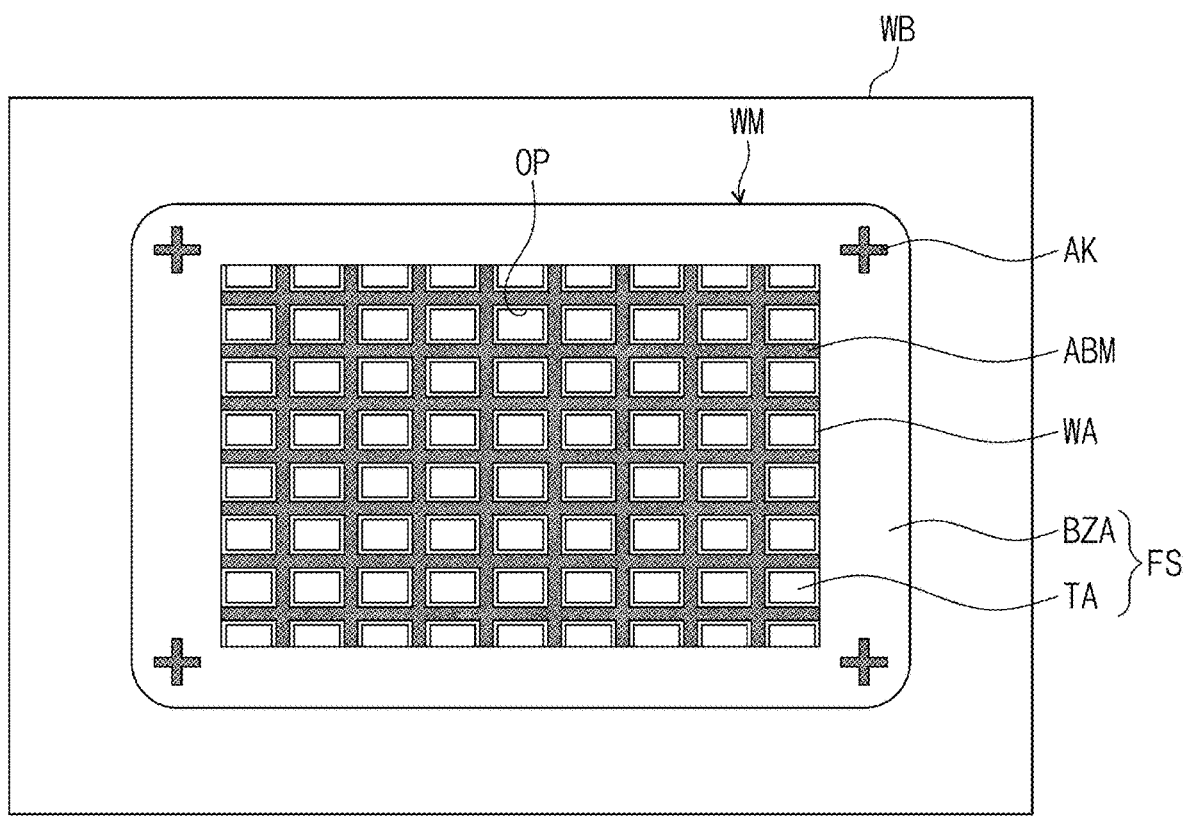
FIG. 9G is a plan view illustrating an exemplary embodiment of a method of manufacturing a display apparatus according to the invention.

Referring to FIGS. 9F and 9G, subsequently, the manufacturing method may include forming reflective patterns CC2 and CC3. The reflective patterns CC2 and CC3 may be provided so as to overlap with corresponding ones of the openings OP defined in the partition layer WA. Each of the reflective patterns CC2 and CC3 may be provided by coating an organic material blocking light and performing a photolithography process on the organic material. The reflective patterns CC2 and CC3 may be sequentially provided. The reflective patterns CC2 and CC3 may include organic materials having different colors. A first reflective pattern CC1 in an exemplary embodiment may be provided by patterning the preliminary partition layer CC-A. In other words, the first reflective pattern CC1 may be provided by the same process as that of the partition layer WA, and thus the first reflective pattern CC1 and the partition layer WA may constitute a single unitary body. In some drawings, the first reflective pattern is indicated by the separate reference designator 'CC1' for the purpose of ease and convenience in description.

In an exemplary embodiment of the invention, each of the reflective patterns CC2 and CC3 including the organic materials may be discharged to a corresponding opening OP and thus may be provided. The process of discharging each of the reflective patterns CC2 and CC3 may be performed on a desired opening by the alignment key AK. Since the exemplary embodiment of the alignment key AK includes at least one of the metal and the metal oxide, it may be easily distinguished by the naked eye in a process. Thus, the organic layers disposed on the window layer WM may be easily disposed at desired positions.

In addition, the alignment key AK may be disposed on the bezel area BZA, and thus the alignment key AK may not be visible to the outside through the window layer WM.

Figure 9H:
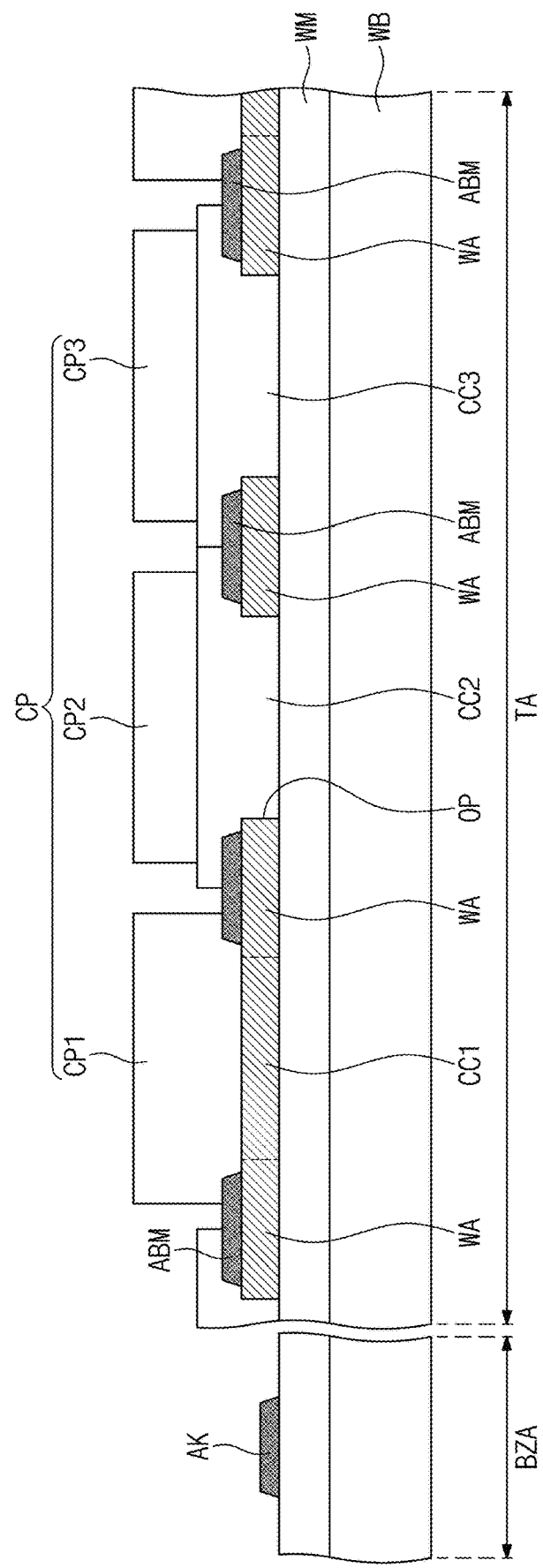

Referring to FIG. 9H, thereafter, the manufacturing method may include forming a color filter layer CP. The color filter layer CP may include first to third color patterns CP1, CP2 and CP3 for emitting lights having different colors. The first to third color patterns CP1, CP2 and CP3 may be disposed on the first to third reflective patterns CC1, CC2 and CC3, respectively. The first to third color patterns CP1, CP2 and CP3 may include quantum dots for emitting different lights.

Referring to FIG. 9I, next, the manufacturing method may include forming a cover inorganic layer CIOL. The cover inorganic layer CIOL may be coated or deposited on the rear surface of the window layer WM. The cover inorganic layer CIOL may cover the color filter layer CP. The first to third color patterns CP1, CP2 and CP3 may be partitioned or divided by the cover inorganic layer CIOL. The cover inorganic layer CIOL may prevent moisture and/or oxygen from permeating into the color filter layer CP.

According to the exemplary embodiments of the invention, the light blocking layer may include the metal element, and thus color mixing between the adjacent light emitting areas may be prevented. In addition, the light blocking layer may reflect light leaked to an adjacent light emitting area and may provide the reflected light to a corresponding light emitting area, and thus the display apparatus with improved luminous efficiency may be provided or realized.

While the invention has been described with reference to exemplary embodiments, it will be apparent to those skilled in the art that various changes and modifications may be made without departing from the spirits and scopes of the invention. Therefore, it should be understood that the above embodiments are not limiting, but illustrative. Thus, the scopes of the invention are to be determined by the broadest permissible interpretation of the following claims and their equivalents, and shall not be restricted or limited by the foregoing description.

What is claimed is:

1. A display apparatus comprising:
   a display panel comprising:
     a base layer in which an active area and a peripheral area adjacent to the active area are defined; and
   a plurality of pixels which is disposed on the base layer to generate light and overlaps with the active area; and
   a cover panel comprising:
     a window layer in which a transmission area overlapping with the active area and a bezel area adjacent to the transmission area are defined and which includes a rear surface facing the display panel and a front surface opposite to the rear surface;
     an optical filter layer disposed on the rear surface; and
     a color filter layer disposed on the optical filter layer and including quantum dots,
   wherein the optical filter layer comprises:
     a partition layer in which an opening is defined and which includes an organic material and which includes a bottom surface and a top surface opposing the bottom surface and a side surface disposed between the bottom surface and the top surface;
     a light blocking layer disposed on the top surface of the partition layer and including a metal to absorb light leaked to neighboring light emitting areas; and a reflective layer disposed in the opening, wherein a maximum width of the light blocking layer is less than a width of the partition layer such that at least a portion of the side surface and the top surface of the partition layer is exposed by the light blocking layer.

2. The display apparatus of claim 1, wherein the light blocking layer exposes a portion of a top surface, on which the light blocking layer is disposed, of the partition layer.

3. The display apparatus of claim 1, wherein the partition layer has a matrix shape in a plan view, and
   wherein the light blocking layer has a shape corresponding to the matrix shape.

4. The display apparatus of claim 1, wherein the light blocking layer further includes:
   a bottom facing the partition layer; a top opposite to the bottom; and
   a side connecting the bottom and the top, and
   wherein the side is inclined with respect to the bottom.

5. The display apparatus of claim 1, wherein the opening is provided in plural,
   wherein the reflective layer includes first to third reflective patterns having different colors, and
   wherein each of the first to third reflective patterns is disposed in a corresponding one of the openings.

6. The display apparatus of claim 5, wherein one of the first to third reflective patterns includes the organic material of the partition layer.

7. The display apparatus of claim 6, wherein the partition layer and the reflective pattern including the organic material of the first to third reflective patterns define the same plane.

8. The display apparatus of claim 5, wherein at least one of the first to third reflective patterns covers a portion of each of the partition layer and the light blocking layer.

9. The display apparatus of claim 5, wherein the color filter layer includes first to third color patterns overlapping with the first to third reflective patterns, respectively, and
   wherein one of the first to third color patterns transmits the light provided from a corresponding one of the plurality of pixels.

10. The display apparatus of claim 9, further comprising:
    a cover inorganic layer disposed on the color filter layer to partition the first to third color patterns.

11. The display apparatus of claim 10, further comprising:
    a planarization layer disposed between the cover inorganic layer and the display panel to provide a flat surface.

12. The display apparatus of claim 1, wherein the light provided from the plurality of pixels is blue light.

13. The display apparatus of claim 1, wherein each of the plurality of pixels comprises:
    a transistor; and
    an organic light emitting element connected to the transistor, and
    wherein the organic light emitting element comprises: a first electrode connected to the transistor; a second electrode facing the first electrode; and an emission pattern disposed between the first electrode and the second electrode.

14. The display apparatus of claim 1, wherein each of the plurality of pixels comprises:
    a transistor; and
    a liquid crystal display element connected to the transistor, and
    wherein the liquid crystal display element comprises:
    a first electrode connected to the transistor;
    a second electrode facing the first electrode; and
    a liquid crystal layer disposed between the first electrode and the second electrode.

15. The display apparatus of claim 1, wherein the light blocking layer reflects light provided from the color filter layer toward the color filter layer.

16. The display apparatus of claim 1, further comprising:
    at least one alignment key disposed on the bezel area,
    wherein the at least one alignment key includes a same material as that of the light blocking layer.

17. The display apparatus of claim 16, wherein the at least one alignment key is provided by a same process as that of the light blocking layer.

18. A method of manufacturing a display apparatus, the method comprising:
    providing a window layer including a transmission area and a bezel area adjacent to the transmission area on a work substrate;
    forming a partition layer having a plurality of openings on the window layer;

forming a preliminary light blocking layer including a metal material on the window layer;

forming a light blocking layer by patterning the preliminary light blocking layer disposed on the transmission area to absorb light leaked to neighboring light emitting areas; forming an alignment key by patterning the preliminary light blocking layer disposed on the bezel area; forming reflective patterns having different colors in corresponding ones of the plurality of openings; and forming a color filter layer including quantum dots on the reflective patterns, wherein the light blocking layer and the alignment key are provided by a same process, and wherein a maximum width of the light blocking layer is less than a width of the partition layer such that at least a portion of the side surface and the top surface of the partition layer is exposed by the light blocking layer.

19. The method of claim 18, wherein each of the reflective patterns is aligned with a corresponding one of the openings by the alignment key.

20. The method of claim 18, wherein the light blocking layer is disposed on the partition layer.

\* \* \* \* \*